United States Patent
Ikeda et al.

(10) Patent No.: US 8,847,726 B2
(45) Date of Patent: Sep. 30, 2014

(54) METHOD FOR MANUFACTURING ESD PROTECTION DEVICE AND ESD PROTECTION DEVICE

(75) Inventors: Tetsuya Ikeda, Nagaokakyo (JP); Takayuki Tsukizawa, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/565,878

(22) Filed: Aug. 3, 2012

(65) Prior Publication Data

US 2013/0201585 A1 Aug. 8, 2013

Related U.S. Application Data

(63) Continuation of application No. PCT/JP2011/051768, filed on Jan. 28, 2011.

(30) Foreign Application Priority Data

Feb. 4, 2010 (JP) .................................. 2010-022735
Feb. 15, 2010 (JP) .................................. 2010-030741

(51) Int. Cl.
| | | |
|---|---|---|
| H01C 7/10 | (2006.01) | |
| H01C 7/13 | (2006.01) | |
| H02H 9/04 | (2006.01) | |
| H05K 1/02 | (2006.01) | |
| H01T 21/00 | (2006.01) | |
| H05F 3/02 | (2006.01) | |
| H01T 4/12 | (2006.01) | |
| H05K 3/46 | (2006.01) | |
| H05K 1/16 | (2006.01) | |

(52) U.S. Cl.
CPC ............. *H02H 9/044* (2013.01); *H05K 3/4629* (2013.01); *H05K 2201/096* (2013.01); *H05K 1/026* (2013.01); *H05K 1/16* (2013.01); *H05K 1/0259* (2013.01); *H01T 21/00* (2013.01); *H05F 3/02* (2013.01); *H01T 4/12* (2013.01)
USPC ............................................................ 338/21

(58) Field of Classification Search
USPC ............................................................ 338/21
See application file for complete search history.

(56) References Cited

U.S. PATENT DOCUMENTS 7,994,893 B2 * 8/2011 Matsuoka ........................ 338/21
8,426,889 B2 * 4/2013 Adachi et al. .................. 257/173

(Continued)

FOREIGN PATENT DOCUMENTS

| CN | 101542856 A | 9/2009 |
|---|---|---|
| JP | 54-069342 U | 5/1979 |

(Continued)

OTHER PUBLICATIONS

Tsukizawa et al., "ESD Protection Device," U.S. Appl. No. 13/570,277, filed Aug. 9, 2012.

(Continued)

*Primary Examiner* — Kyung Lee
(74) *Attorney, Agent, or Firm* — Keating & Bennett, LLP

(57) ABSTRACT

In a method for manufacturing an ESD protection device and an ESD protection device, on sheets defining insulating layers, portions defining a first connection conductor and a second connection conductor and a portion defining a mixed portion are formed, then the sheets are laminated and heated. The mixed portion is formed using a mixed portion formation material containing a cavity formation material and a solid component containing at least one of (i) a metal and a semiconductor, (ii) a metal and ceramic, (iii) a metal, a semiconductor, and ceramic, (iv) a semiconductor and ceramic, (v) a semiconductor, (vi) a metal coated with an inorganic material, (vii) a metal coated with an inorganic material and a semiconductor, (viii) a metal coated with an inorganic material and ceramic, and (ix) a metal coated with an inorganic material, a semiconductor, and ceramic. The cavity formation material disappears during heating.

16 Claims, 15 Drawing Sheets

(56) References Cited

U.S. PATENT DOCUMENTS

| | | |
|---|---|---|
| 2002/0008952 A1 | 1/2002 | Shin |
| 2009/0002906 A1 | 1/2009 | Liu et al. |
| 2009/0067113 A1 | 3/2009 | Urakawa |
| 2010/0254052 A1* | 10/2010 | Katsumura et al. ............. 361/56 |
| 2010/0309595 A1 | 12/2010 | Adachi et al. |
| 2011/0222197 A1* | 9/2011 | Adachi et al. .................... 361/56 |
| 2011/0222203 A1* | 9/2011 | Adachi et al. .................. 361/220 |
| 2012/0187212 A1* | 7/2012 | Hira .......................... 239/102.2 |

FOREIGN PATENT DOCUMENTS

| | | | |
|---|---|---|---|
| JP | 03-194878 A | 8/1991 | |
| JP | 06-068949 A | 3/1994 | |
| JP | 09-266053 A | 10/1997 | |
| JP | 11-354248 A | 12/1999 | |
| JP | 2001-043954 A | 2/2001 | |
| JP | 2001-076840 A | 3/2001 | |
| JP | 2001-185322 A | 7/2001 | |
| JP | 2001-267037 A | 9/2001 | |
| JP | 2002-093546 A | 3/2002 | |
| JP | 2003-059616 A | 2/2003 | |
| JP | 2003-297524 A | 10/2003 | |
| JP | 2005-276513 A | 10/2005 | |
| JP | 2006-294357 A | 10/2006 | |
| JP | 2009-009944 A | 1/2009 | |
| JP | 2009-238563 A | 10/2009 | |
| JP | 2009-295760 A | 12/2009 | |
| WO | 2009/098944 A1 | 8/2009 | |

OTHER PUBLICATIONS

Official Communication issued in International Patent Application No. PCT/JP2011/051768, mailed on Apr. 19, 2011.

Official Communication issued in corresponding Japanese Patent Application No. 2011-552752, mailed on Sep. 24, 2013.

* cited by examiner

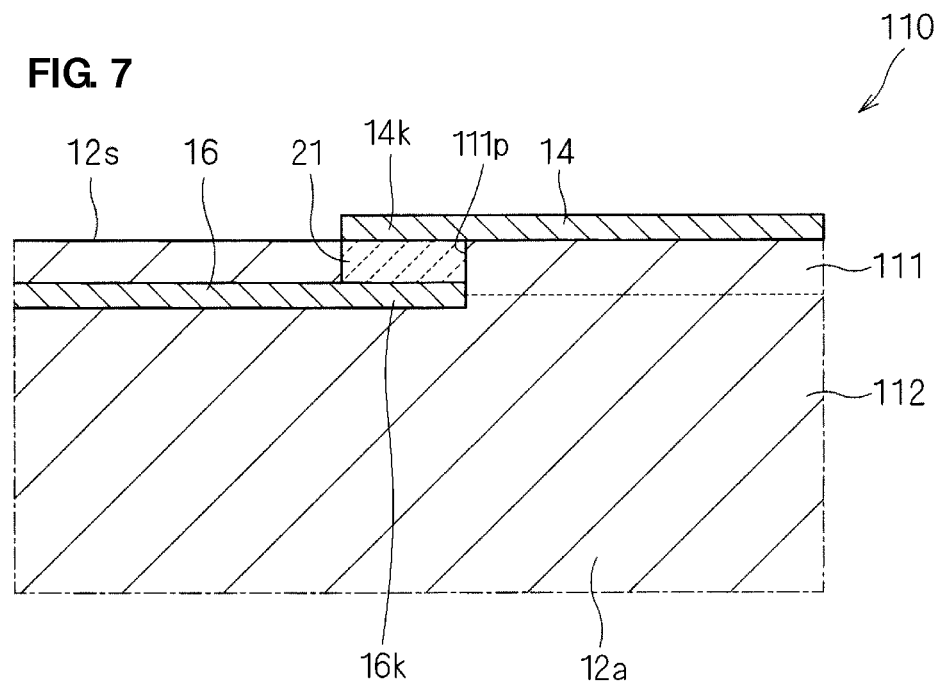
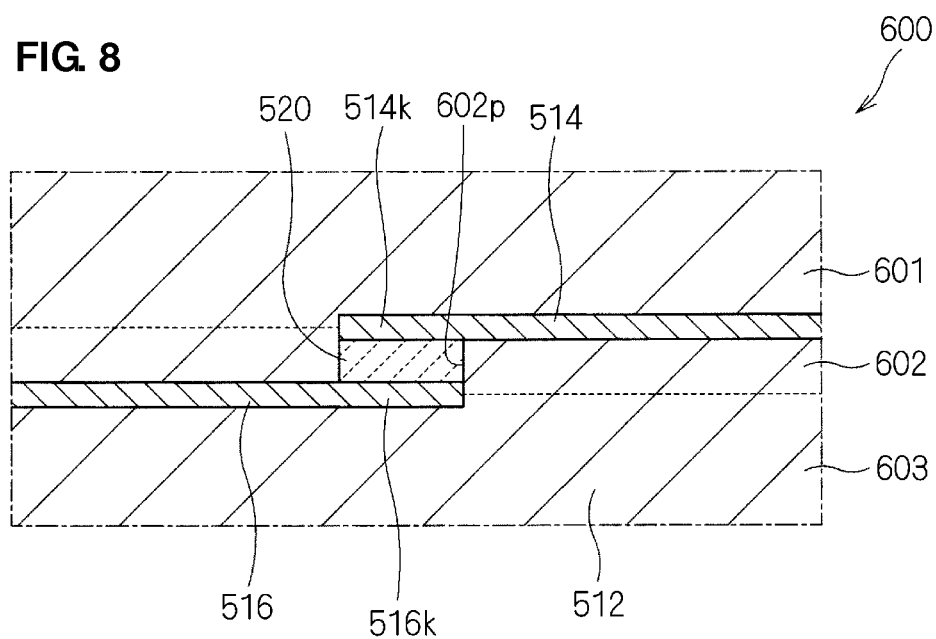

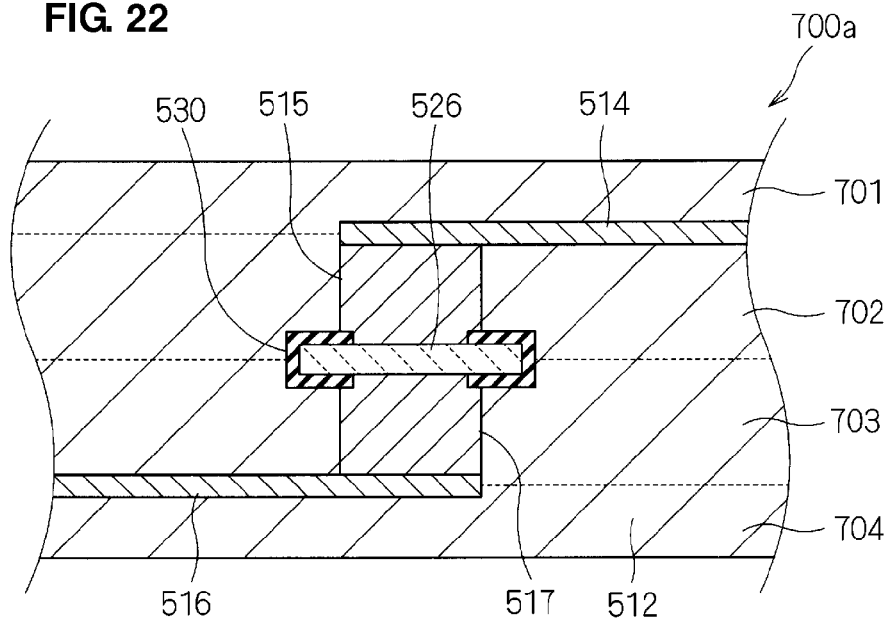
FIG. 22
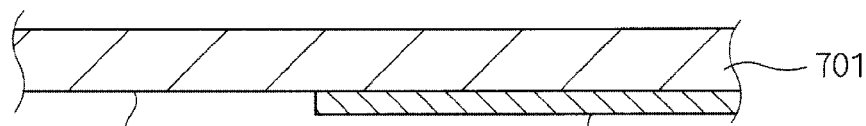
FIG. 23A
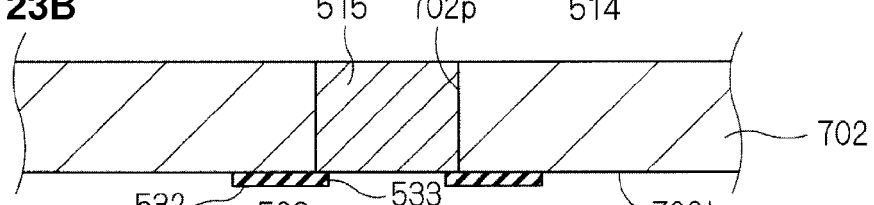
FIG. 23B
FIG. 23C
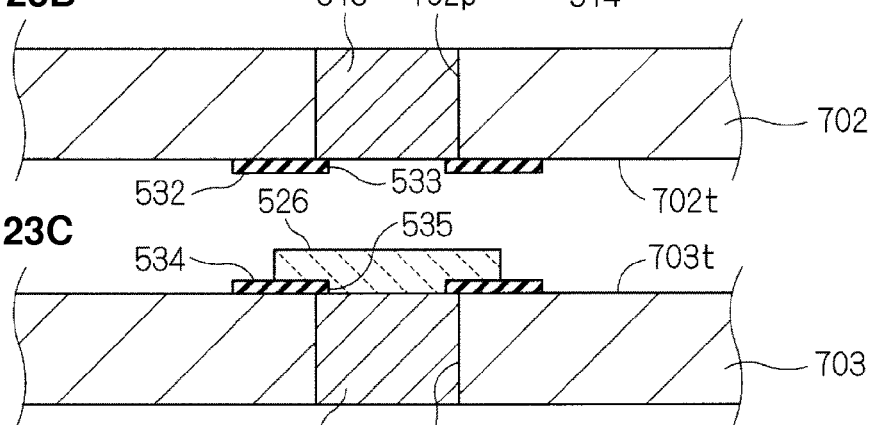
FIG. 23D
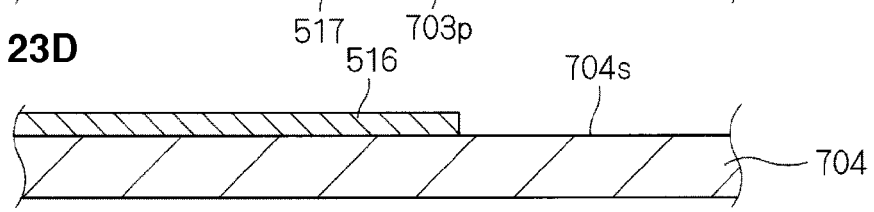

METHOD FOR MANUFACTURING ESD PROTECTION DEVICE AND ESD PROTECTION DEVICE

BACKGROUND OF THE INVENTION

1. Field of the Invention

The present invention relates to a method for manufacturing an Electro-Static Discharge (ESD) protection device and an ESD protection device and more specifically relates to a method for manufacturing an ESD protection device, such as a single component (ESD protection device) having only an ESD protection function and a composite component (module) having an ESD protection function and another function and an ESD protection device.

2. Description of the Related Art

ESD refers to a phenomenon such that when an electrified conductive object (human body or the like) contacts or sufficiently approaches another conductive object (electronic device or the like), intense electric discharge occurs. The ESD causes problems, such as, damaging or malfunctioning of electronic devices. In order to prevent such problems, it is necessary to prevent the application of an excessive voltage generated in electric discharge to a circuit of electronic devices. For use in such an application, an ESD protection device is provided and is also referred to as a surge absorption element or a surge absorber.

The ESD protection device is disposed, for example, between a signal line and the ground of a circuit. The ESD protection device has a structure in which a pair of electric discharge electrodes are disposed facing each other with a space provided therebetween. Therefore, the ESD protection device has high resistance in a usual use state, so that signals do not flow into the ground side. In contrast, when an excessive voltage is applied as in the case where static electricity is applied from antennas of cellular phones and the like, for example, electric discharge occurs between the electric discharge electrodes of the ESD protection device, so that the static electricity can be led to the ground side. Thus, a voltage caused by static electricity is not applied to a latter circuit relative to the ESD device, so that the circuit can be protected.

For example, an ESD protection device illustrated in an exploded perspective view of FIG. 24 and a cross sectional view of FIG. 25, a cavity portion 5 is formed in a ceramic multilayer substrate 7 in which insulating ceramic sheets 2 are to be laminated, electric discharge electrodes 6 which are conductive with external electrodes 1 are disposed facing each other in the cavity portion 5, and electric discharge gas is confined in the cavity portion 5. When a voltage causing dielectric breakdown between the electric discharge electrodes 6 is applied, electric discharge occurs between the electric discharge electrodes 6 in the cavity portion 5. The electric discharge can lead an excessive voltage to the ground, so that a latter circuit can be protected (See, for example, Japanese Unexamined Patent Application Publication No. 2001-43954).

In the ESD protection device, the firing potential is adjusted mainly by adjusting the interval of the electric discharge electrodes disposed to face each other along the main surface of the insulating layer. However, since the interval of the electric discharge electrodes is likely to vary due to device manufacturing variations, shrinkage when firing the ceramic substrate, or the like, it is difficult to adjust the interval with good accuracy. Therefore, the adjustment or the stabilization of the ESD characteristics, such as a peak voltage value, is not easily achieved. The peak voltage value refers to a peak voltage value applied to a protection circuit when a static electricity test is performed at 8 kV contact discharge based on ICE61000-4-2. When the value is lower, the static electricity inhibitory effect is more excellent.

SUMMARY OF THE INVENTION

In view of the above, preferred embodiments of the present invention provide a method for manufacturing an ESD protection device and an ESD protection device in which adjustment and stabilization of the ESD characteristics is facilitated.

A method for manufacturing an ESD protection device according to a preferred embodiment of the present invention includes a first process of preparing a plurality of sheets defining insulating layers, forming portions defining a first connection conductor and a second connection conductor and a portion defining a mixed portion which is disposed between the first and second connection conductors and is connected to the first and second connection conductors in at least one of the sheets, and then alternately laminating the sheets to form a laminate, and a second process of heating the laminate to form the first and second connection conductors and the mixed portion in an insulating substrate in which the insulating layers are laminated. In the first process, the portions defining the first and second connection conductors are formed using materials having conductivity and the portion defining the mixed portion is formed using a mixed portion formation material containing a mixture of a cavity formation material which disappears due to an increase in temperature during heating in the second process and a solid component containing at least one of (i) a metal and a semiconductor, (ii) a metal and ceramic, (iii) a metal, a semiconductor, and ceramic, (iv) a semiconductor and ceramic, (v) a semiconductor, (vi) a metal coated with an inorganic material, (vii) a metal coated with an inorganic material and a semiconductor, (viii) a metal coated with an inorganic material and ceramic, and (ix) a metal coated with an inorganic material, a semiconductor, and ceramic. In the second process, the mixed portion is formed in which cavities formed by the disappearance of the cavity formation material in the mixed portion formation material of the portion defining the mixed portion due to an increase in temperature during heating and the solid components in the mixed portion formation material are dispersed.

In this case, when a voltage of a magnitude equal to or higher than a predetermined value is applied between the first connection conductor and the second connection conductor, electric discharge occurs in the mixed portion.

According to the method described above, when the cavity formation material in the mixed portion formation material disappears, cavities are formed in portions where the cavity formation material was present. Therefore, the mixed portion can be easily produced in which the solid component containing at least one of (i) a metal and a semiconductor, (ii) a metal and ceramic, (iii) a metal, a semiconductor, and ceramic, (iv) a semiconductor and ceramic, (v) a semiconductor, (vi) a metal coated with an inorganic material, (vii) a metal coated with an inorganic material and a semiconductor, (viii) a metal coated with an inorganic material and ceramic, and (ix) a metal coated with an inorganic material, a semiconductor, and ceramic and the cavities are dispersed.

In the ESD protection device produced by the method described above, since, in the mixed portion disposed between the first and second connection conductors, the solid component containing at least one of (i) a metal and a semiconductor, (ii) a metal and ceramic, (iii) a metal, a semiconductor, and ceramic, (iv) a semiconductor and ceramic, (v) a semiconductor, (vi) a metal coated with an inorganic material, (vii) a metal coated with an inorganic material and a semiconductor, (viii) a metal coated with an inorganic material and ceramic, and (ix) a metal coated with an inorganic material, a semiconductor, and ceramic and the cavities are dispersed, short-circuits can be prevented and also the movement of electrons is likely to occur along the solid components having conductivity in the mixed portion when applying a voltage.

According to the method described above, the prevention of short circuits or the adjustment of the ESD characteristics, such as the peak voltage value, can be reliably and stably performed by adjusting the size and the amount of the cavities of the mixed portion by the cavity formation material.

Preferably, the sheets are ceramic green sheets and the insulating substrate is a ceramic multilayer substrate.

In this case, the disappearance of the cavity formation material can be achieved by heating when firing the ceramic multilayer substrate, and the formation of the mixed portion is easy.

Preferably, the cavity formation material is a disappearable resin. In this case, the production is easy.

Preferably, the disappearable resin is an acrylic bead.

Preferably, the solid components in the mixed portion formation material contain a metal material coated with an inorganic material having insulation properties and a semiconductor material.

In this case, since the metal material and the semiconductor material are dispersed in the mixed portion where electric discharge occurs, the movement of electrons is likely to occur and an electric discharge phenomenon is more efficiently caused, so that the ESD responsiveness can improve.

In one preferred embodiment of the present invention, the semiconductor material is silicon carbide or zinc oxide, for example.

Preferably, in the first process, the portion defining the mixed portion is preferably formed by forming, in at least one of the sheets, a penetration hole that penetrates between the main surfaces of the sheet, and then charging the mixed portion formation material into the penetration hole.

In this case, the thickness of the mixed portion can be adjusted by adjusting the thickness of the sheet.

Preferably, in the first process, the portion defining the mixed portion is formed by applying the mixed portion formation material to at least one main surface of the sheet.

In this case, since the mixed portion can be formed by a thick film printing method, the mixed portion can be easily formed. Since the mixed portion can be formed on an arbitrary insulating layer, the degree of freedom of design of the mixed portion increases.

Preferably, in the first process, a seal layer is formed which extends between the sheet and the portion defining the mixed portion. In the second process, the seal layer prevents the movement of the solid components in the sheet to the portion defining the mixed portion.

In this case, the entrance of the solid components in the sheet into the mixed portion can be prevented.

An ESD protection device according to a preferred embodiment of the present invention includes an insulating substrate including insulating layers laminated on each other, at least two first and second connection conductors provided in the insulating substrate and having conductivity, and a mixed portion provided in the insulating substrate, disposed between the first and second connection conductors, and including at least one solid component of (i) a metal and a semiconductor, (ii) a metal and ceramic, (iii) a metal, a semiconductor, and ceramic, (iv) a semiconductor and ceramic, (v) a semiconductor, (vi) a metal coated with an inorganic material, (vii) a metal coated with an inorganic material and a semiconductor, (viii) a metal coated with an inorganic material and ceramic, and (ix) a metal coated with an inorganic material, a semiconductor, and ceramic. In the mixed portion, the solid components and the cavities are dispersed.

In the above-described configuration, when a voltage of a magnitude equal to or higher than a predetermined value is applied between the first connection conductor and the second connection conductor, electric discharge occurs in the mixed portion. Since, in the mixed portion disposed between the first and second connection conductors, at least one solid component of (i) a metal and a semiconductor, (ii) a metal and ceramic, (iii) a metal, a semiconductor, and ceramic, (iv) a semiconductor and ceramic, (v) a semiconductor, (vi) a metal coated with an inorganic material, (vii) a metal coated with an inorganic material and a semiconductor, (viii) a metal coated with an inorganic material and ceramic, and (ix) a metal coated with an inorganic material, a semiconductor, and ceramic and cavities are dispersed, short-circuits can be prevented and also the movement of electrons is likely to occur along the solid components having conductivity in the mixed portion when applying a voltage.

According to the above-described configuration, the prevention of short circuits or the adjustment of the ESD characteristics, such as the peak voltage value, can be reliably and stably performed by adjusting the size and the amount of the cavities of the mixed portion.

Preferably, the insulating substrate is a ceramic multilayer substrate.

In this case, the cavities can be easily formed in the mixed portion by the use of a material which disappears due to heating during firing of the ceramic multilayer substrate.

When the insulating substrate is a ceramic multilayer substrate, the first and second connection conductors are preferably arranged so as to penetrate between the main surfaces of at least one of the insulating layers or arranged along the main surface of the at least one of the insulating layers. The connection conductors, which are different from each other, are connected to the mixed portion so as to face each other in the lamination direction through the mixed portion at both sides in the lamination direction of the insulating layer.

In the above-described configuration, the connection conductors arranged to penetrate between the main surfaces of the insulating layer are interlayer connection conductors. The connection conductors extending along the insulating layer are in-plane connection conductors.

According to the above-described configuration, when a voltage of a magnitude equal to or higher than a predetermined value is applied between the connection conductors which face each other through the mixed portion, electric discharge occurs in the mixed portion. Electric discharge occurs along a region connecting the connection conductors which face each other through the mixed portion. Since the mixed portion in which materials having conductivity are dispersed is provided in the region where electric discharge occurs, the movement of electrons is likely to occur and an electric discharge phenomenon is efficiently caused, so that ESD responsiveness can improve.

The firing potential can be set to a desired value by adjusting the interval (electric discharge gap) of the connection conductors which face each other through the mixed portion together with the type, amount, and the like of the materials different in conductivity contained in the mixed portion.

The interval (electric discharge gap) between the connection conductors which face each other in the lamination direction through the mixed portion can be adjusted by the thickness of the mixed portion. Therefore, as compared with the case where the interval (electric discharge gap) is provided such that the electric discharge electrodes face each other in the direction along the main surface of the insulating layer as in a former example, the interval can be adjusted with excellent accuracy.

Therefore, the adjustment or the stabilization of the ESD characteristics, such as the peak voltage value, is facilitated.

Preferably, the solid components in the mixed portion contain a metal material coated with inorganic materials having insulation properties and a semiconductor material.

In this case, since a metal material and a semiconductor material are dispersed in the mixed portion where electric discharge occurs, the movement of electrons is likely to occur and an electric discharge phenomenon is more efficiently caused, so that the ESD responsiveness can improve.

It is preferred that the semiconductor material is silicon carbide or zinc oxide.

Preferably, a penetration hole is formed, in at least one of the insulating layers of the insulating substrate, which penetrates between the main surfaces of the insulating layer, and the mixed portion is formed in the penetration hole.

In this case, the thickness of the mixed portion can be adjusted by adjusting the thickness of the sheet.

Preferably, the mixed portion is provided between the insulating layers adjacent to each other of the insulating substrate.

In this case, since the mixed portion can be formed by a thick film printing method, the mixed portion can be easily formed. Since the mixed portion can be formed on an arbitrary insulating layer, the degree of freedom of design of the mixed portion increases.

Preferably, a seal layer extending between the insulating layer and the mixed portion is further provided.

In this case, in the manufacturing process of the ESD protection device, the solid components of the insulating layer can be prevented from moving to the mixed portion to enter the mixed portion.

Preferably, the mixed portion includes a metal material and a semiconductor material which are dispersed.

In this case, since, in the mixed portion where electric discharge occurs, the metal material and the semiconductor material are dispersed, the movement of electrons is likely to occur and an electric discharge phenomenon is more efficiently caused, so that ESD responsiveness is significantly improved.

In this case, it is preferred that the semiconductor material is silicon carbide or zinc oxide.

Preferably, in the mixed portion, particles of a metal material coated with an inorganic material having insulation properties are dispersed.

In this case, since the particles of the metal material in the mixed portion do not directly contact due to coating with the inorganic material, a possibility that the particles of the metal material are connected to cause short circuits decreases.

Preferably, the ESD protection device includes two or more of the mixed portions defining a first mixed portion and a second mixed portion, the first and second connection conductors that are connected to one end in the lamination direction of the first mixed portion and connected to one end in the lamination direction of the second mixed portion, respectively, and the connection conductor defining a third connection conductor and connected to the other end in the lamination direction of the first mixed portion and the other end in the lamination direction of the second mixed portion. When first and second terminals are electrically connected to the first and second connection conductors, respectively, the first and second mixed portions are electrically connected in series between the first and second terminals through the third connection conductor.

In this case, due to the fact that the first and second mixed portions are connected in series, even when short-circuit occurs in one side when an electrostatic pulse is repeatedly applied, the other side functions. Therefore, as compared with the case where the number of the mixed portions is only one, the reliability of the ESD protection function improves.

Preferably, the ESD protection device includes two or more of the mixed portions defining a first mixed portion and a second mixed portion, the first and second connection conductors that are connected to one end in the lamination direction of the first mixed portion and connected to one end in the lamination direction of the second mixed portion, respectively, and the connection conductor defining a third connection conductor and connected to the other end in the lamination direction of the first mixed portion and the other end in the lamination direction of the second mixed portion. When first, second, and third terminals are electrically connected to the first, the second, and the third connection conductors, respectively, the first and second mixed portions are electrically connected in parallel between the first and second terminals and the third terminal.

In this case, since the first and second mixed portions are connected in parallel, the electric discharge area becomes large. As a result, the ESD responsiveness becomes good and the peak voltage value can be reduced.

Preferably, the ESD protection device includes an electronic component mounted on the ceramic multilayer substrate or in the ceramic multilayer substrate, one or more of the connection conductors defining a fourth connection conductor and connected to at least one terminal of the electronic component, and one or more of the connection conductors defining a fifth connection conductor. The fourth and the fifth connection conductors are connected to both sides in the lamination direction of the mixed portions so as to face each other in the lamination direction through the mixed portions.

In this case, as compared with the case where the electronic component and the ESD protection device are separately mounted on the substrate, the distance between the electronic component and the mixed portion can be shortened to increase the ESD responsiveness to thereby improve the ESD protection function.

According to various preferred embodiments of the present invention, the adjustment or the stabilization of the ESD characteristics is facilitated.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7 is a cross sectional view of the principal portion of an ESD protection device according to a second preferred embodiment of the present invention.

FIG. 8 is a cross sectional view of the principal portion of the ESD protection device according to a third preferred embodiment of the present invention.

FIG. 22 is a cross sectional view of the principal portion of an ESD protection device according to a first amendment of the eighth preferred embodiment of the present invention.

FIGS. 23A-23D are exploded cross sectional views of manufacturing processes of the ESD protection device according to the first modification of the eighth preferred embodiment of the present invention.

DETAILED DESCRIPTION OF THE PREFERRED EMBODIMENTS

Hereinafter, preferred embodiments of the invention are described with reference to FIGS. 1 to 23D.

First Preferred Embodiment

An ESD protection device 100 according to a first preferred embodiment is described with reference to FIGS. 1 to 3.

Figure 1:
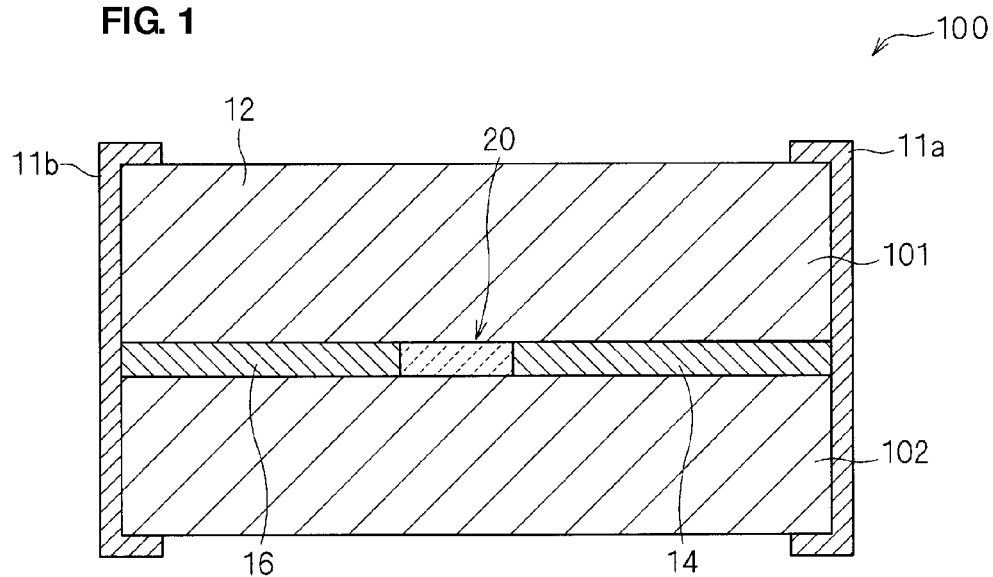
FIG. 1 is a cross sectional view of an ESD protection device according to a first preferred embodiment of the present invention.

FIG. 1 is a cross sectional view of an ESD protection device 100. As illustrated in FIG. 1, in the ESD protection device 100, a mixed portion 20 and first and second in-plane connection conductors 14 and 16 are included in a ceramic multilayer substrate 12 in which first and second insulating layers 101 and 102 containing a ceramic material are laminated. The mixed portion 20 and the first and second in-plane connection conductors 14 and 16 are formed between the first and second insulating layers 101 and 102 adjacent to each other.

The mixed portion 20 is disposed between the first and second in-plane connection conductors 14 and 16 and is connected to the first and second in-plane connection conductors 14 and 16. The first and second in-plane connection conductors 14 and 16 are first and second connection conductors.

The first and second in-plane connection conductors 14 and 16 extend to the side surfaces of the ceramic multilayer substrate 12 and are connected to first and second external terminals 11a and 11b, respectively.

Figure 2:
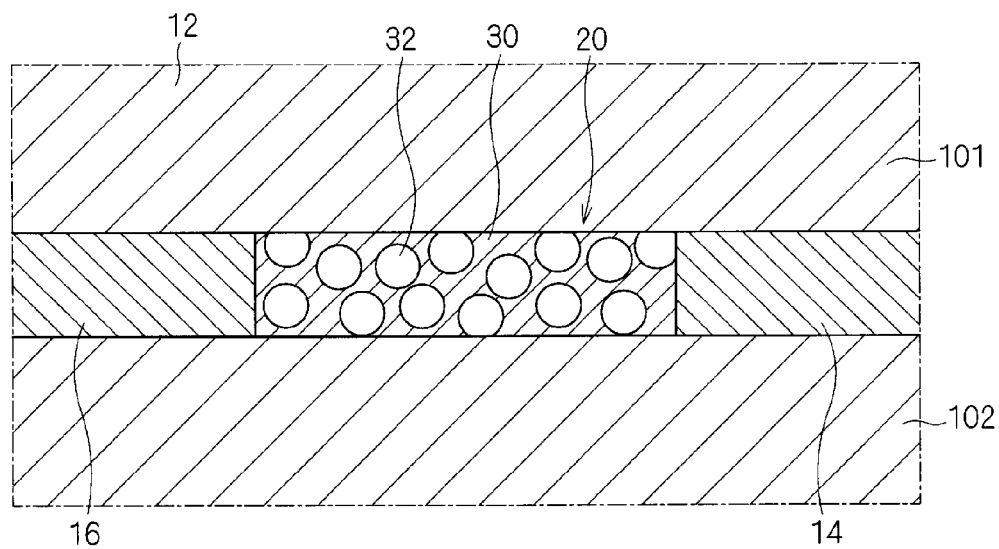
FIG. 2 is an enlarged cross sectional view of the principal portion of the ESD protection device according to the first preferred embodiment of the present invention.

As schematically illustrated in the enlarged cross sectional view of the principal portion of FIG. 2, cavities 32 are dispersed in a solid portion 30 in the mixed portion 20.

In the solid portion 30 of the mixed portion 20, solid components containing at least one of (i) a metal and a semiconductor, (ii) a metal and ceramic, (iii) a metal, a semiconductor, and ceramic, (iv) a semiconductor and ceramic, (v) a semiconductor, (vi) a metal coated with an inorganic material, (vii) a metal coated with an inorganic material and a semiconductor, (viii) a metal coated with an inorganic material and ceramic, and (ix) a metal coated with an inorganic material, a semiconductor, and ceramic are dispersed. The mixed portion 20 has insulation properties as a whole.

In the solid portion 30 of the mixed portion 20, metal materials coated with inorganic materials having insulation properties and semiconductor materials, for example, are dispersed. For example, the metal materials are Cu particles having a diameter of about 2 μm to about 3 μm, the inorganic materials are $Al_2O_3$ particles having a diameter of about 1 μm or lower, and the semiconductor materials contain any one of silicon carbide, zinc oxide, and the like.

The inorganic materials and the semiconductor materials may react to each other when firing, and may deteriorate after firing. Moreover, the semiconductor material and the ceramic powder constituting the ceramic multilayer substrate may also react to each other when firing, and may deteriorate after firing.

When the metal materials are not coated with inorganic materials, the metal materials may contact each other in a state before firing, so that the metal materials may be connected to each other to cause short-circuit. In contrast, when the metal materials are coated with inorganic materials, the metal materials may not contact each other before firing. Moreover, even when the inorganic materials deteriorate after firing, the state where the metal materials are separated is held. Therefore, due to the fact that the metal materials are coated with inorganic materials, the possibility that the metal materials are connected to each other to cause short-circuits decreases.

In place of the metal materials coated with inorganic materials, a material defining the mixed portion may be constituted by a metal material and a semiconductor or ceramic, or combining them. Or, a material defining the mixed portion may be constituted by using no metal materials and using only a semiconductor, only a semiconductor and ceramic, or only a metal material coated with inorganic materials.

In the ESD protection device 100 illustrated in FIGS. 1 and 2, when a voltage higher than a predetermined value is applied from the external terminals 11a and 11b, electric discharge occurs through the mixed portion 20 between the first and second in-plane connection conductors 14 and 16 facing each other.

The firing potential can be set to a desired value by adjusting the length of a portion where the first and second in-plane connection conductors 14 and 16 face each other (i.e., electric discharge gap), the interval between the first and second in-plane connection conductors 14 and 16 (i.e., electric discharge gap), or the amount, the type, or the like of materials contained in the mixed portion 20.

In the mixed portion 20, two or more kinds of solid components different in the conductivity in the solid portion 30 and the cavities 32 are dispersed. Therefore, short-circuits can be prevented, and also when a voltage is applied, the movement of electrons is likely to occur along the solid components having conductivity in the solid portion 30 of the mixed portion 20. By adjusting the size or the amount of the cavities 32 of the mixed portion 20, it becomes possible to stably prevent short-circuit or adjust the ESD characteristics, such as the peak voltage value.

The mixed portion 20 preferably contains not only metal materials but semiconductor materials. Therefore, even when the content of the metal materials is low, desired ESD responsiveness can be obtained. Moreover, the occurrence of short-circuits caused by the contact of metal materials can be prevented.

The components of the materials contained in the mixed portion 20 may be partially or entirely the same as the materials constituting the ceramic multilayer substrate 12. When the same materials are contained, the shrinkage behavior or the like of the mixed portion 20 when firing can be easily fitted to that of the ceramic multilayer substrate 12 and the adhesiveness of the mixed portion 20 to the ceramic multilayer substrate 12 increases, so that separation of the mixed portion 20 when firing is difficult to occur. Moreover, the ESD repetition resistance also improves. Moreover, the types of the materials to be used can be reduced.

The metal materials contained in the mixed portion 20 may be the same as or different from the materials of the first and second in-plane connection conductors 14 and 16. When the materials are the same, the shrinkage behavior or the like of the mixed portion 20 is easily matched to that of the first and second in-plane connection conductors 14 and 16 and the types of the materials to be used can be reduced.

Next, a non-limiting example of a method for manufacturing the ESD protection device 100 is described.

First, ceramic green sheets defining the first and second insulating layers 101 and 102 are prepared. For the ceramic material defining the materials of the ceramic multilayer substrate 12, materials having a composition mainly containing Ba, Al, and Si are used. The raw materials are prepared and mixed so as to have a predetermined composition, and then fired at 800° C. to 1000° C. The obtained fired powder is ground in a zirconia ball mill for 12 hours to obtain ceramic powder. To the ceramic powder, organic solvents, such as toluene•EKINEN, are added and mixed. Furthermore, a binder and a plasticizer are added and mixed to obtain a slurry.

The slurry thus obtained is molded by a doctor blade method to obtain ceramic green sheets having a thickness of about 50 μm defining the first and second insulating layers 101 and 102.

Separately, an electrode paste for forming the first and second in-plane connection conductors 14 and 16 is prepared. The electrode paste is obtained by adding a solvent to 80 wt % of Cu powder having an average particle diameter of about 1.5 μm and a binder resin containing ethyl cellulose or the like, and stirring and mixing them by a roll.

Separately, a mixed paste which is a mixed portion formation material for forming the mixed portion 20 is prepared. The mixed paste contains solid components and a cavity formation material. The mixed paste is obtained by preparing alumina coated Cu particles having an average particle diameter of about 3 μm, silicon carbide (SiC) having an average particle diameter of about 1 μm, and acrylic beads as the cavity formation material at a predetermined ratio, adding a binder resin and a solvent, and then stirring and mixing them by a roll. The Cu particles and the SiC, and the acrylic resin beads are 1:1 in terms of volume ratio. The proportion of the resin and the solvent in the mixed paste is 40 wt %. The alumina coated Cu particles and the SiC are solid components and maintain insulation properties after firing. The acrylic bead is the cavity formation material which disappears during firing.

On the ceramic green sheet defining the second insulating layer 102, the mixed paste is applied by screen printing to form a portion defining the mixed portion 20. The portion defining the mixed portion 20 may be formed on the ceramic green sheet defining the first insulating layer 101.

Next, on the ceramic green sheet defining the second insulating layer 102, the electrode paste is applied by screen printing to form portions defining the first and second in-plane connection conductors 14 and 16. The portions defining the first and second in-plane connection conductors 14 and 16 may be formed on the ceramic green sheet defining the first insulating layer 101.

After forming the portions defining the first and second in-plane connection conductors 14 and 16, the portion defining the mixed portion 20 may be formed.

The ceramic green sheets are laminated and pressure-bonded similarly as a usual ceramic multilayer substrate.

Similarly as a chip-type electronic component, such as an LC filter, the laminate is cut by a micro-cutter to be divided into chips. Thereafter, an electrode paste is applied to the end surfaces to form external terminals.

Subsequently, the resultant substance is fired in an $N_2$ atmosphere similarly as a usual ceramic multilayer substrate. In the case of electrode materials (Ag and the like) which do not oxidize, an air atmosphere is acceptable. By firing, the organic solvent in the ceramic green sheet or the binder resin, the solvent, and the acrylic beads in the mixed paste disappear. Thus, the mixed portion 20 in which the $Al_2O_3$ coated Cu, the SiC, and the cavities 32 are dispersed is formed.

Figure 3:
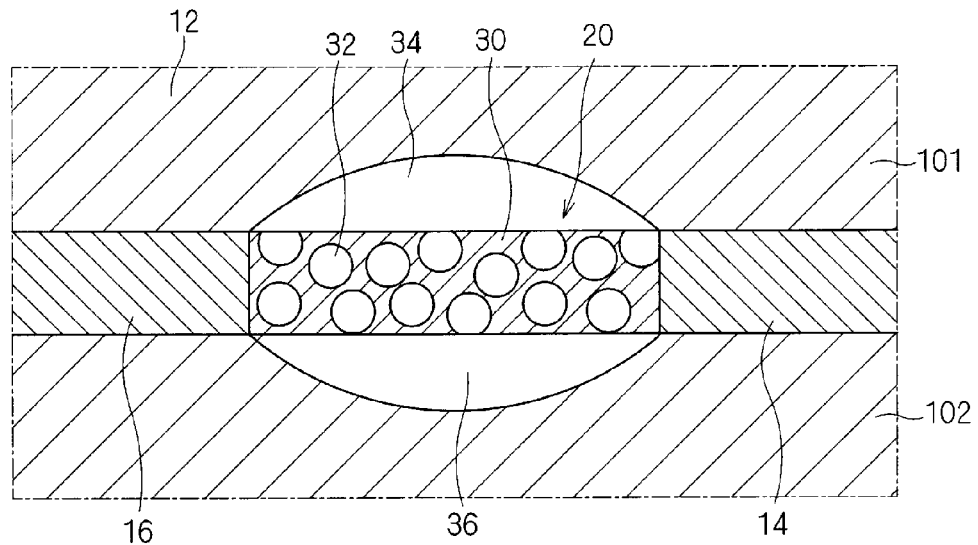
FIG. 3 is an enlarged cross sectional view of the principal portion of the ESD protection device according to the first preferred embodiment of the present invention.

When the proportion of the cavity formation material in the mixed paste is increased, hollow portions 34 and 36 can be formed between the mixed portion 20 and the insulating layers 101 and 102 as schematically illustrated in the cross sectional view of the principal portion of FIG. 3.

The external terminals are subjected to electrolysis Ni—Sn plating similarly as a chip-type electronic component, such as an LC filter.

Thus, the ESD protection device 100 whose cross section is constituted as illustrated in FIG. 1 is completed.

Semiconductor materials are not particularly limited to the materials mentioned above. For example, metal semiconductors, such as silicon and germanium, carbides, such as silicon carbide, titanium carbide, zirconium carbide, molybdenum carbide, and tungsten carbide, nitrides, such as titanium nitride, zirconium nitride, chromium nitride, vanadium nitride, and tantalum nitride, silicides, such as titanium silicide, zirconium silicide, tungsten silicide, molybdenum silicide, and chromium silicide, borides, such as titanium boride, zirconium boride, chromium boride, lantern boride, molybdenum boride, and tungsten boride, and oxides, such as zinc oxide and strontium titanate, can be used. In particular, silicon carbide or zinc oxide is particularly preferable because it is relatively inexpensive and various particle diameters are commercially available. These semiconductor materials may be used alone or as a mixture of two or more kinds thereof as appropriate. The semiconductor materials may be mixed with resistant materials, such as alumina or a BAS material, as appropriate, for use.

The metal materials are not particularly limited to the materials mentioned above. Cu, Ag, Pd, Pt, Al, Ni, W, Mo, alloys thereof, and a combination thereof are acceptable.

As the cavity formation material, beads containing PET, polypropylene, ethylene cellulose, or the like or containing a combination thereof are acceptable in addition to the acrylic beads.

Although the first preferred embodiment describes a case where the ESD protection device 100 preferably is a single component (ESD protection device) having only an ESD protection function, the ESD protection device may be a composite component (module) or the like having an ESD protection function and another function. When the ESD protection device is a component module (module) or the like, at least the mixed portion 20 and the first and second in-plane connection conductors 14 and 16 connected to the mixed portion 20 is provided.

First Modification of First Preferred Embodiment

An ESD protection device of a first modification of the first preferred embodiment is described with reference to FIGS. 4 to 6B.

Figure 4:
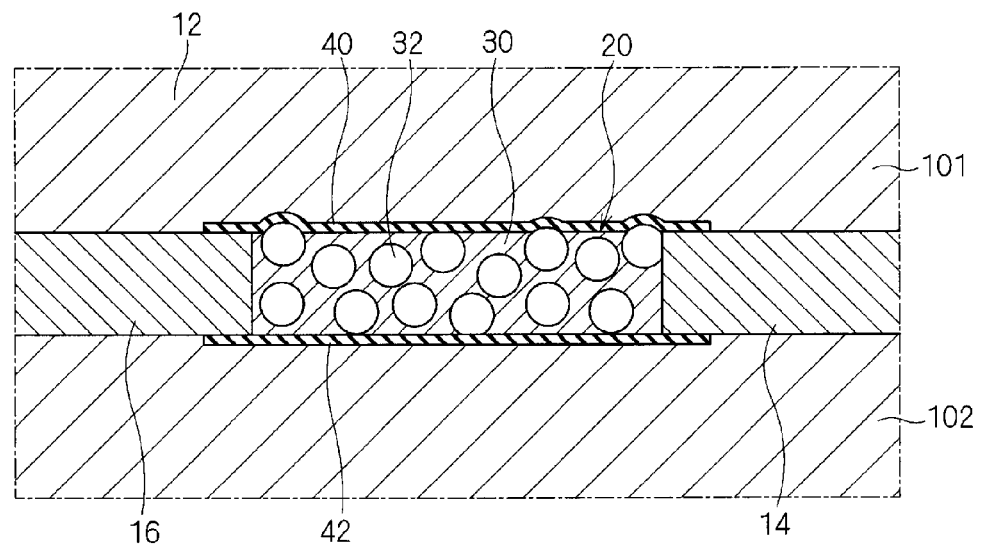
FIG. 4 is an enlarged cross sectional view of the principal portion of an ESD protection device according to a first modification of the first preferred embodiment of the present invention.
Figure 5:
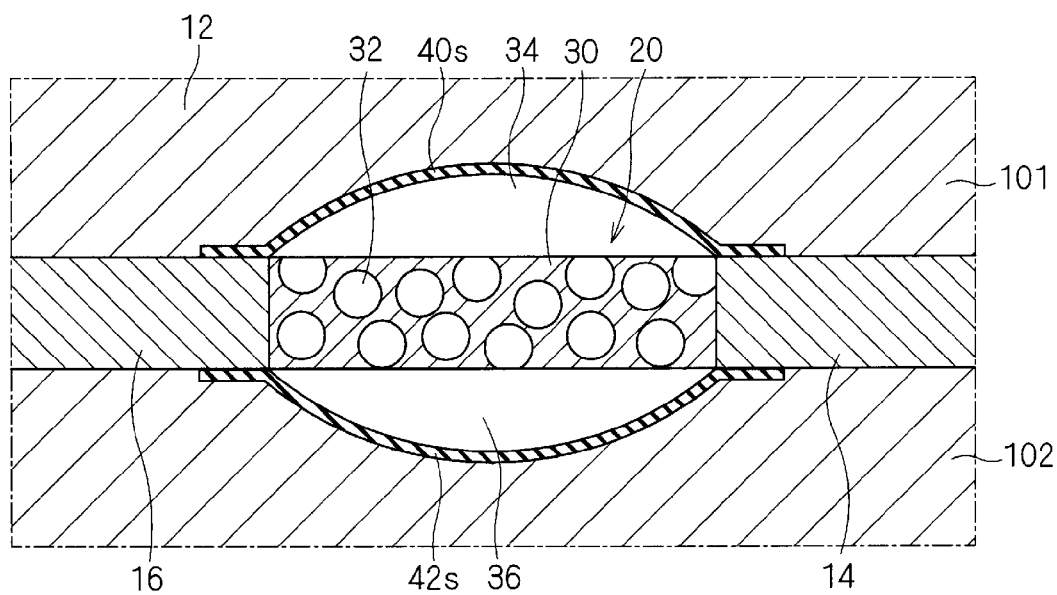
FIG. 5 is an enlarged cross sectional view of the principal portion of the ESD protection device according to the modification of the first preferred embodiment of the present invention.

FIGS. 4 and 5 are enlarged cross sectional views of the principal portion of the ESD protection device of the first modification of the first preferred embodiment. The ESD protection device of the first modification of the first preferred embodiment is constituted substantially similarly as the ESD protection device 100 of the first preferred embodiment. In the following description, differences from the first preferred embodiment are mainly described by using the same reference numerals for the same constituent portions as those of the first preferred embodiment.

As illustrated in FIGS. 4 and 5, the ESD protection device of the first modification of the first preferred embodiment is provided with seal layers 40 and 42 in addition to the configuration of the first preferred embodiment. The seal layers 40 and 42 are preferably provided between the mixed portion 20 and the first and second insulating layers 101 and 102 of the ceramic multilayer substrate 12. The seal layers 40 and 42 prevent glass components in the ceramic multilayer substrate 12 from entering the mixed portion 20. The seal layers 40 and 42 have insulation properties.

Figure 6A:
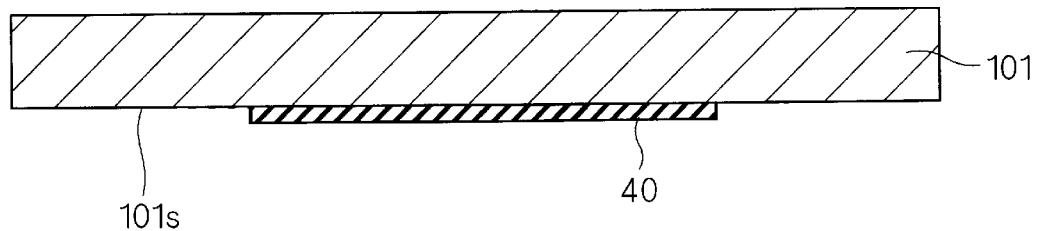
FIGS. 6A and 6B are cross sectional views of manufacturing processes of the ESD protection device according to the first modification of the first preferred embodiment of the present invention.
Figure 6B:
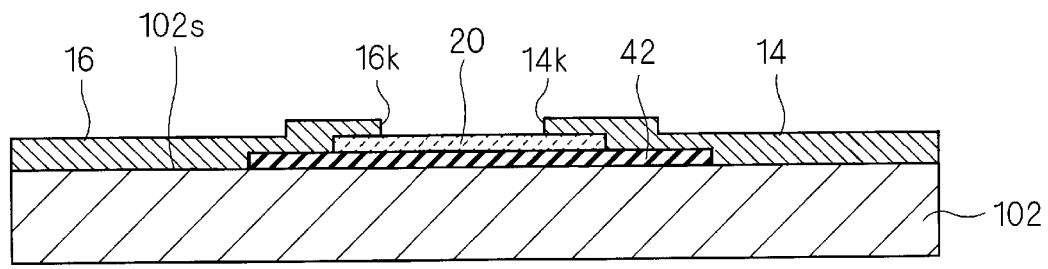

The seal layers 40 and 42 can be produced by forming ceramic green sheets defining the first and second insulating layers 101 and 102 as illustrated in the cross sectional views of FIGS. 6A and 6B, laminating, pressure-bonding, and firing them.

More specifically, as illustrated in FIGS. 6A and 6B, the seal layers 40 and 42 are preferably formed by screen-printing a seal layer formation paste to surfaces 101s and 102s facing each other of the ceramic green sheets defining the first and second insulating layers 101 and 102, respectively, and then the seal layers 40 and 42 are dried.

The seal layer formation paste for forming the seal layers 40 and 42 is produced by the same technique as that for the electrode paste. For example, by adding a solvent to a binder resin containing 80 wt % of $Al_2O_3$ powder having an average particle diameter of about 1 μm, ethyl cellulose, and the like, and then stirring and mixing them by a roll, the seal layer formation paste (alumina paste) is obtained. For the solid components of the seal layer formation paste, a material whose sintering temperature is higher than that of the materials of the ceramic multilayer substrate is selected.

Subsequently, as illustrated in FIG. 6B, the mixed portion 20 is formed using a mixed paste on the seal layer 42 of the ceramic green sheet defining the second insulating layer 102. Furthermore, portions defining the first and second in-plane connection conductors 14 and 16 are formed on the ceramic green sheet defining the second insulating layer 102 using the electrode paste. After forming the portions defining the first and second in-plane connection conductors 14 and 16, the portion defining the mixed portion 20 may be formed.

The seal layer 40 may be formed on the ceramic green sheet defining the second insulating layer 102. More specifically, the seal layer 42, the portion defining the mixed portion 20, and the portions defining the first and second in-plane connection conductors 14 and 16 may be formed on the ceramic green sheet defining the second insulating layer 102, and thereafter the seal layer 40 may be formed. On the contrary, the seal layer 40, the portions defining the first and second in-plane connection conductors 14 and 16, and the portion defining the mixed portion 20 may be formed on the ceramic green sheet defining the first insulating layer 101, and thereafter the seal layer 42 may be formed.

Second Preferred Embodiment

An ESD protection device 110 of a second preferred embodiment of the present invention is described with reference to FIG. 7.

FIG. 7 is a cross sectional view of the principal portion of the ESD protection device 110 of the second preferred embodiment. As illustrated in FIG. 7, the ESD protection device 110 of the second preferred embodiment includes a mixed portion 21 provided in a via hole 111p of an insulating layer 111 at the outermost portion of a ceramic multilayer substrate 12a in which insulating layers 111 and 112 containing a ceramic material are laminated. Two or more kinds of solid components different in the conductivity and cavities are dispersed in the mixed portion similarly as in the mixed portion 20 of first preferred embodiment. The mixed portion 21 can be formed by forming the via hole 111p in the ceramic green sheet defining the insulating layer 111, and then charging a mixed paste into the via hole 111p.

To both ends in the lamination direction (vertical direction in FIG. 7) of the mixed portion 21, facing portions 14k and 16k of the in-plane connection conductors 14 and 16, respectively, are connected and face each other through the mixed portion 21. One in-plane connection conductor 14 is exposed to a surface 12s of the ceramic multilayer substrate 12a.

In the ESD protection device 110, since the size between the facing portions 14k and 16k of the in-plane connection conductors 14 and 16, respectively, which face each other through the mixed portion 21 can be adjusted by the thickness of the insulating layer 111 of the ceramic multilayer substrate 12a, the thickness of the mixed portion 21 where materials for assisting electric discharge are dispersed can be formed with good accuracy.

Moreover, since the mixed portion 21 is formed in the via hole 111p, the electric discharge area can be reduced in such a manner that the diameter is about 50 μm to about 300 μm, for example, and a structure in which an inductor, a capacitor, and the like are compounded in the same component can be easily produced.

One in-plane connection conductor 14 exposed to the surface 12s of the ceramic multilayer substrate 12a can be used as, for example, a connection electrode to mount an electronic component on the ceramic multilayer substrate 12a or an external terminal to mount the ESD protection device 110 on another circuit board.

The ESD protection device 110 can shorten wiring to the mixed portion 21 functioning as an ESD protection element to thereby reduce leading loss.

Although not illustrated, in addition to the configuration of the second preferred embodiment, a seal layer may be formed between the periphery of the mixed portion 21 and the insulating layer 111. In this case, after the formation of the via hole 111p, the seal layer formation paste is applied only to the periphery portion of the via hole 111p by charging the seal layer formation paste used in the first modification of the first preferred embodiment and also sucking the seal layer formation paste from a via hole opposite to the charging side, and then dried. Thereafter, by charging a mixed paste into the via hole 111p, the mixed portion 21 having a seal layer at the periphery portion of the via hole 111p can be formed. The seal layer prevents the glass component in the ceramic substrate from entering the mixed portion 21. The seal layer has insulation properties.

Third Preferred Embodiment

An ESD protection device 600 of a third preferred embodiment of the present invention is described with reference to FIGS. 8, 19, and 20.

FIG. 8 is a cross sectional view of the principal portion of the ESD protection device 600. As illustrated in FIG. 8, the ESD protection device 600 includes in-plane connection conductors 514 and 516 having conductivity and a mixed portion 520 in a ceramic multilayer substrate 512 in which a plurality of insulating layers 601 to 603 containing a ceramic material are laminated. The in-plane connection conductors 514 and 516 extend between the insulating layers 601 and 602 adjacent to each other and the insulating layers 602 and 603 adjacent to each other respectively. The mixed portion 520 is provided in a via hole 602p which is a penetration hole which penetrates between the main surfaces of the insulating layer 602. In the in-plane connection conductors 514 and 516, facing portions 514k and 516k, respectively, face each other through the mixed portion 520. In the mixed portion 520, the facing portions 514k and 516k of the in-plane connection conductors 514 and 516, respectively, are connected to both sides in the lamination direction (vertical direction in FIG. 8) of the insulating layers 601 to 603.

The mixed portion 520 contains at least one of (i) a metal and a semiconductor, (ii) a metal and ceramic, (iii) a metal, a semiconductor, and ceramic, (iv) a semiconductor and ceramic, (v) a semiconductor, (vi) a metal coated with an inorganic material, (vii) a metal coated with an inorganic material and a semiconductor, (viii) a metal coated with an inorganic material and ceramic, and (ix) a metal coated with an inorganic material, a semiconductor, and ceramic. The materials are dispersed in the mixed portion 520.

Figure 20:
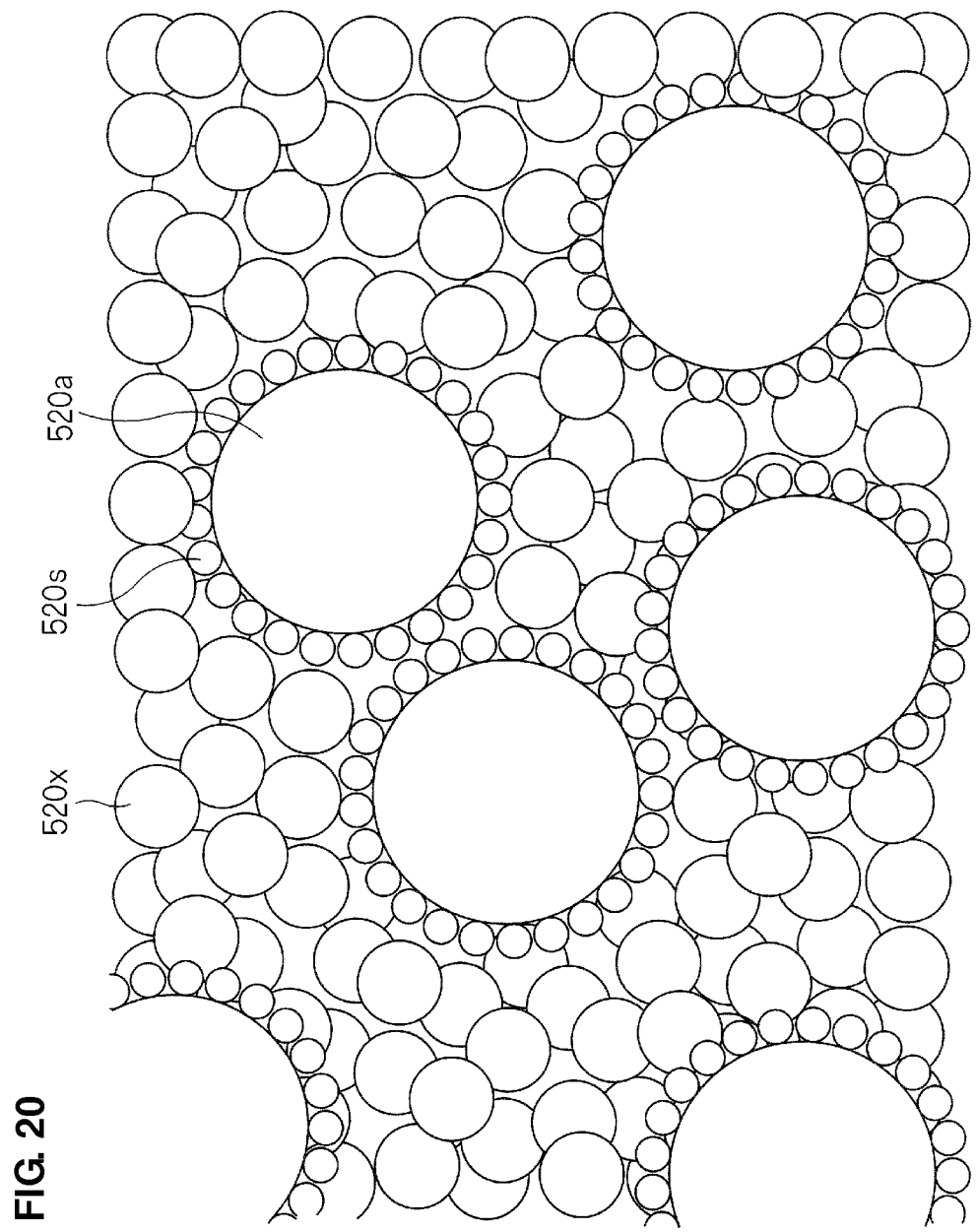
FIG. 20 is a schematic view schematically illustrating the organization of a mixed portion before firing according to the third first preferred embodiment of the present invention.

In detail, as the organization is schematically illustrated in the schematic view of FIG. 20, the mixed portion 520 before firing contains metal materials 520a coated with inorganic materials 520s having insulation properties and semiconductor materials 520x. For example, the metal materials 520a are Cu particles having a diameter of about 2 μm to about 3 μm, the inorganic materials 520s are $Al_2O_3$ particles having a diameter of about 1 μm or lower, and the semiconductor materials 520x contain any one of silicon carbide, silicon, and the like.

The inorganic materials and the semiconductor materials may react to each other when firing, and may deteriorate after firing. The semiconductor materials and the ceramic powder constituting the ceramic multilayer substrate may also react to each other when firing, and may deteriorate after firing.

When the metal materials are not coated with inorganic materials, the metal materials may contact each other in a state before firing, so that the metal materials may be connected to each other to cause short-circuit. In contrast, when the metal materials are coated with inorganic materials, the metal materials may not contact each other before firing. Moreover, even when the inorganic materials deteriorate after firing, the state where the metal materials are separated is held. Therefore, due to the fact that the metal materials are coated with inorganic materials, a possibility that the metal materials are connected to each other to cause short-circuit decreases.

In the ESD protection device 600 illustrated in FIG. 8, when a voltage equal to or higher than a predetermined value is applied between the in-plane connection conductors 514 and 516, electric discharge occurs between the facing portion 514k and 516k which face each other through the mixed portion 520.

The firing potential can be set to a desired value by adjusting the size between the facing portions 514k and 516k of the in-plane connection conductors 514 and 516, i.e., the thickness of the mixed portion 520, the amount or the type of the metal materials or the semiconductor materials contained in the mixed portion 520.

The accuracy of the thickness of the mixed portion 520 is dependent on the accuracy of the thickness of the insulating layer 602. The thickness of the insulating layer 602 can be set with an accuracy of about 12.5 μm±1.5%, for example. The accuracy of the size between the facing portions 514k and 516k of the electric discharge electrodes 514 and 516, respectively, which face each other through the mixed portion 520 can improve by about single digit as compared with the case where an interval (electric discharge gap) is arranged such that the electric discharge electrodes face each other in the direction along the main surface of the insulating layer as in former examples. Therefore, the setting accuracy of the firing potential can be increased to thereby increase the ESD characteristics (peak voltage value).

The mixed portion 520 contains not only metal materials but semiconductor materials. Therefore, even when the content of the metal materials is low, at least desired ESD responsiveness can be obtained. Then, the occurrence of short-circuits caused by the contact of the metal materials can be prevented.

The components of the materials contained in the mixed portion 520 may be partially or entirely the same as materials constituting the ceramic multilayer substrate 512. When the same materials are contained, the shrinkage behavior or the like of the mixed portion 520 when firing can be easily fitted to that of the ceramic multilayer substrate 512 and the adhesiveness of the mixed portion 520 to the ceramic multilayer substrate 512 increases, so that separation of the mixed portion 520 when firing is difficult to occur. Moreover, the ESD repetition resistance also improves. Moreover, the types of the materials to be used can be reduced.

The metal materials contained in the mixed portion 520 may be the same as or different from the materials of the first and second in-plane connection conductors 514 and 516. When the materials are the same, the shrinkage behavior or the like of the mixed portion 520 is easily fitted to that of the first and second in-plane connection conductors 514 and 516 and the types of the materials to be used can be reduced.

When the mixed portion 520 contains metal materials and ceramic materials, the shrinkage behavior of the mixed portion 520 when firing can be set to an intermediate state between those of the in-plane connection conductors 514 and 516 and the ceramic multilayer substrate 512. Thus, differences in the shrinkage behavior when firing between the facing portions 514k and 516k of the in-plane connection conductors 514 and 516, respectively, and the ceramic multilayer substrate 512 can be reduced by the mixed portion 520. As a result, defects caused by the separation or the like of the facing portions 514k and 516k of the in-plane connection conductors 514 and 516, respectively, or variation in characteristics can be reduced. Moreover, since variation in the interval between the facing portions 514k and 516k of the in-plane connection conductors 514 and 516 is also reduced, variation in the characteristics, such as the firing potential, can be reduced.

Moreover, the coefficient of thermal expansion of the mixed portion 520 can be set to an intermediate value between the in-plane connection conductors 514 and 516 and the ceramic multilayer substrate 512. Thus, differences in the coefficient of thermal expansion between the facing portions 514k and 516k of the in-plane connection conductors 514 and 516, respectively, and the ceramic multilayer substrate 512 can be reduced by the mixed portion 520. As a result, defects caused by the separation or the like of the facing portions 514k and 516k of the in-plane connection conductors 514 and 516, respectively, or changes of the characteristics with time can be reduced.

The ESD protection device 600 preferably is a single component (ESD protection device) having only an ESD protection function and a composite component (module) having an ESD protection function and the other function.

Figure 19:
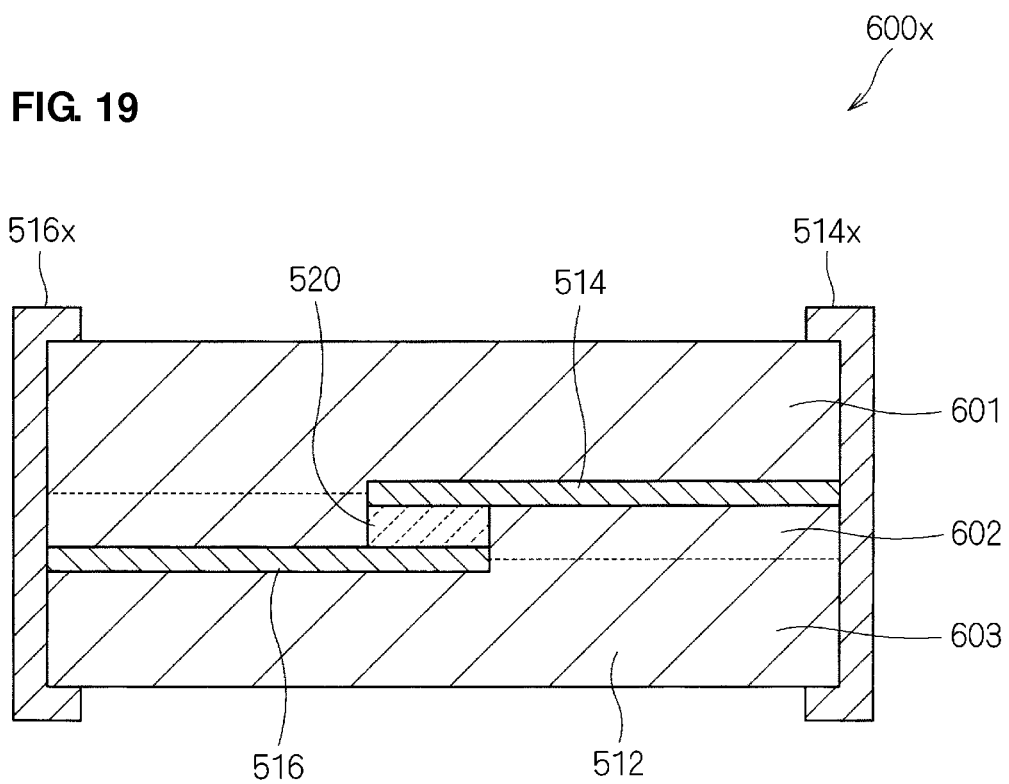
FIG. 19 is a cross sectional view of the principal portion of an ESD protection device according to the third preferred embodiment of the present invention.

For example, as illustrated in the cross sectional view of FIG. 19, when the ESD protection device 600 is a single component having an ESD protection function, i.e., an ESD protection device 600x, the in-plane connection conductors 514 and 516 are connected to external terminals 514x and 516x, respectively.

When the ESD protection device 600 is a composite component (module), a portion surrounded by the chain line in FIG. 8 is provided as one portion of the configuration of the composite component (module) or the like.

Next, a non-limiting example of a method for manufacturing the ESD protection device according to the present preferred embodiment is described. Herein, the method is described taking the case where the ESD protection device is a component (ESD protection device) as an example. However, also when the ESD protection device is a composite component (module) or the like, the ESD protection device can be similarly manufactured.

For the ceramic material defining the materials of the ceramic multilayer substrate 512, materials containing a composition mainly containing Ba, Al, and Si are used. The raw materials are prepared and mixed in such a manner as to have a predetermined composition, and then fired at 800° C. to 1000° C. The obtained fired powder is ground in a zirconia ball mill for 12 hours to obtain ceramic powder. To the ceramic powder, an organic solvent, such as toluene•EKINEN, is added and mixed. A binder and a plasticizer are further added and mixed to obtain a slurry. The slurry thus obtained is molded by a doctor blade method to obtain a 50 μm thick ceramic green sheet.

Separately, an electrode paste for forming the in-plane connection conductors 514 and 516 is produced. The electrode paste is obtained by adding a solvent to a binder resin containing 80 wt % of Cu powder having an average particle diameter of about 1.5 μm, ethyl cellulose, and the like, and then stirring and mixing them by a roll.

A mixed paste for forming the mixed portion 520 is obtained by preparing $Al_2O_3$ coated Cu powder having an average particle diameter of about 2 μm and silicon carbide (SiC) having an average particle diameter of about 1 μm as a semiconductor material at a predetermined ratio, adding a binder resin and a solvent, and then stirring and mixing them by a roll. The mixed paste contains 20 wt % of the binder resin and the solvent and the remaining 80 wt % of the $Al_2O_3$ coated Cu powder and the silicon carbide.

On ceramic green sheets defining the insulating layers 601 and 603, the electrode paste is applied by screen printing to form the electric discharge electrodes 514 and 516 having the facing portions 514k and 516k.

Separately, a via hole is formed using laser or a metallic mold in a ceramic green sheet defining the insulating layer 602, and then the mixed paste is charged into the via hole by screen printing in order to form the mixed portion 520.

The ceramic green sheets are laminated and pressure-bonded similarly as a usual ceramic multilayer substrate.

Similarly as a chip-type electronic component, such as an LC filter, the laminate is cut by a micro-cutter to be divided into chips. Thereafter, an electrode paste is applied to the end surfaces to form external terminals.

Subsequently, the resultant substance is fired in an $N_2$ atmosphere similarly as a usual ceramic multilayer substrate. In the case of electrode materials (Ag and the like) which do not oxidize, an air atmosphere is acceptable. By firing, the organic solvent in the ceramic green sheet and the binder resin and the solvent in the mixed paste disappear.

Electrolysis Ni—Sn plating is performed on the external terminals similarly as a chip-type electronic component, such as an LC filter.

Thus, the ESD protection device 600x whose cross section is constituted as illustrated in FIG. 19 is completed.

In the ESD protection device 600, the size between the facing portions 514k and 516k of the in-plane connection conductors 514 and 516 which face each other through the mixed portion 520 can be adjusted by the thickness of the insulating layer 602 of the ceramic multilayer substrate 512. Therefore, the thickness of the mixed portion 520 in which materials for assisting electric discharge are dispersed can be formed with good accuracy.

Since the mixed portion 520 is formed in the via hole 602p, the electric discharge area can be reduced in such a manner that the diameter is about 50 μm to about 300 μm, for example, and a structure in which an inductor, a capacitor, and the like are compounded in the same component is easily obtained.

Semiconductor materials are not particularly limited to the materials mentioned above. For example, metal semiconductors, such as silicon and germanium, carbides, such as silicon carbide, titanium carbide, zirconium carbide, molybdenum carbide, and tungsten carbide, nitrides, such as titanium nitride, zirconium nitride, chromium nitride, vanadium nitride, and tantalum nitride, silicides, such as titanium silicide, zirconium silicide, tungsten silicide, molybdenum silicide, and chromium silicide, borides, such as titanium boride, zirconium boride, chromium boride, lantern boride, molybdenum boride, and tungsten boride, and oxides, such as zinc oxide and strontium titanate, can be used. In particular, silicon carbide or zinc oxide is particularly preferable because it is relatively inexpensive and various particle diameters are commercially available. These semiconductor materials may be used alone or as a mixture of two or more kinds thereof as appropriate. The semiconductor materials may be mixed with resistant materials, such as alumina or a BAS material, as appropriate, for use.

The metal materials are not particularly limited to the materials mentioned above. Cu, Ag, Pd, Pt, Al, Ni, W, Mo, alloys thereof, and combinations thereof are acceptable.

First Modification of Third Preferred Embodiment

Figure 9:
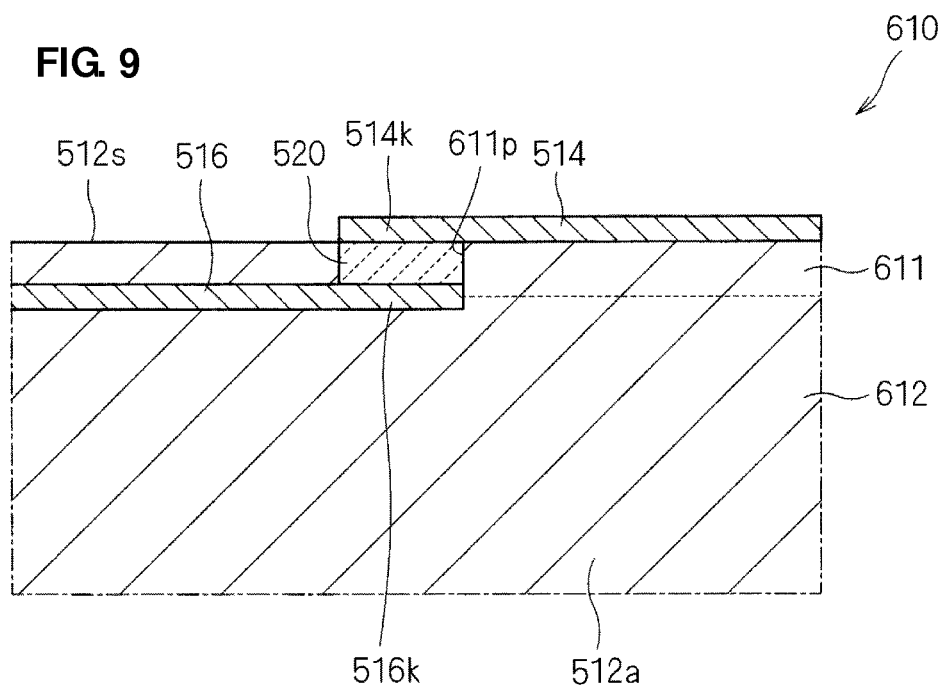
FIG. 9 is a cross sectional view of the principal portion of an ESD protection device according to a modification of the third preferred embodiment of the present invention.

FIG. 9 is a cross sectional view of the principal portion of an ESD protection device 610 of a first modification of the third preferred embodiment of the present invention.

As illustrated in FIG. 9, the mixed portion 520 is formed, in a ceramic multilayer substrate 12a in which insulating layers 611 and 612 containing ceramic material are laminated, in a via hole 611p of the insulating layer 611 at the outermost portion of the ceramic multilayer substrate 512a. Among the in-plane connection conductors 514 and 516 which face each other through the mixed portion 520, one in-plane connection conductor 514 is exposed to a surface 512s of the ceramic multilayer substrate 512a.

The one in-plane connection conductor 514 exposed to the surface 512s of the ceramic multilayer substrate 512a can be used as, for example, a connection electrode to mount an electronic component on the ceramic multilayer substrate 512a or an external terminal for mounting the ESD protection device 610 on another circuit board.

The ESD protection device 610 can shorten wiring to the mixed portion 520 functioning as an ESD protection element to thereby reduce leading loss.

Fourth Preferred Embodiment

An ESD protection device 620 according to a fourth preferred embodiment of the present invention is described with reference to FIG. 10.

Figure 10:
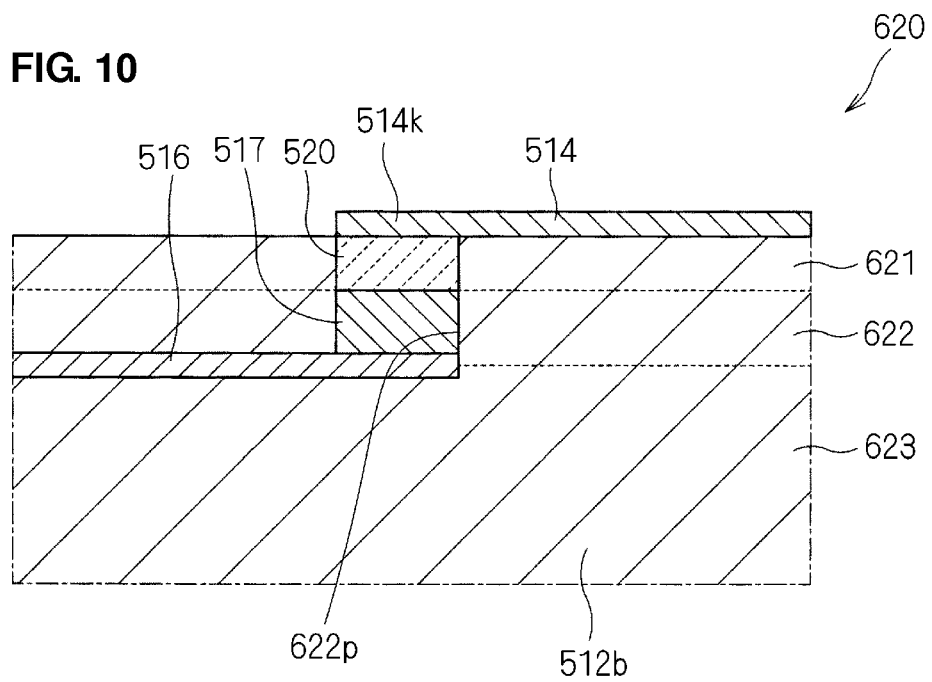
FIG. 10 is a cross sectional view of the principal portion of an ESD protection device according to a fourth preferred embodiment of the present invention.

FIG. 10 is a cross sectional view of the principal portion of the ESD protection device 620 of the fourth preferred embodiment. As illustrated in FIG. 10, the ESD protection device 620 is constituted substantially similarly as the ESD protection device 600 of Example 3. In the following description, differences from the third preferred embodiment are mainly described by using the same reference numerals for the same constituent portions as those of the third preferred embodiment.

Although the ESD protection device 620 of the fourth preferred embodiment includes a ceramic multilayer substrate 512b in which a plurality of insulating layers 621 to 623 containing a ceramic material are laminated, the in-plane connection conductors 514 and 516, and the mixed portion 520 similarly as in the third preferred embodiment, an interlayer connection conductor 517 is further provided unlike the third preferred embodiment.

The interlayer connection conductor 517 is formed so as to penetrate between the main surfaces of the insulating layer 622. More specifically, the interlayer connection conductor 517 is formed in a via hole 622p which penetrates between the main surfaces of the insulating layer 622. The interlayer connection conductor 517 has conductivity.

The mixed portion 520 is connected to the facing portion 514k of one in-plane connection conductor 514 and the interlayer connection conductor 517. The interlayer connection conductor 517 is connected to the other in-plane connection conductor 516.

When a voltage equal to or higher than a predetermined value is applied between the in-plane connection conductors 514 and 516, electric discharge occurs between the facing portion 514k of the one in-plane connection conductor 514 and the interlayer connection conductor 517 which face each other through the mixed portion 520.

Due to the fact that the ESD protection device 620 includes not only the in-plane connection conductors 514 and 516 but the interlayer connection conductor 517 in combination, the degree of freedom for design in the ceramic multilayer substrate 512b increases.

First Modification of Fourth Preferred Embodiment

Figure 11:
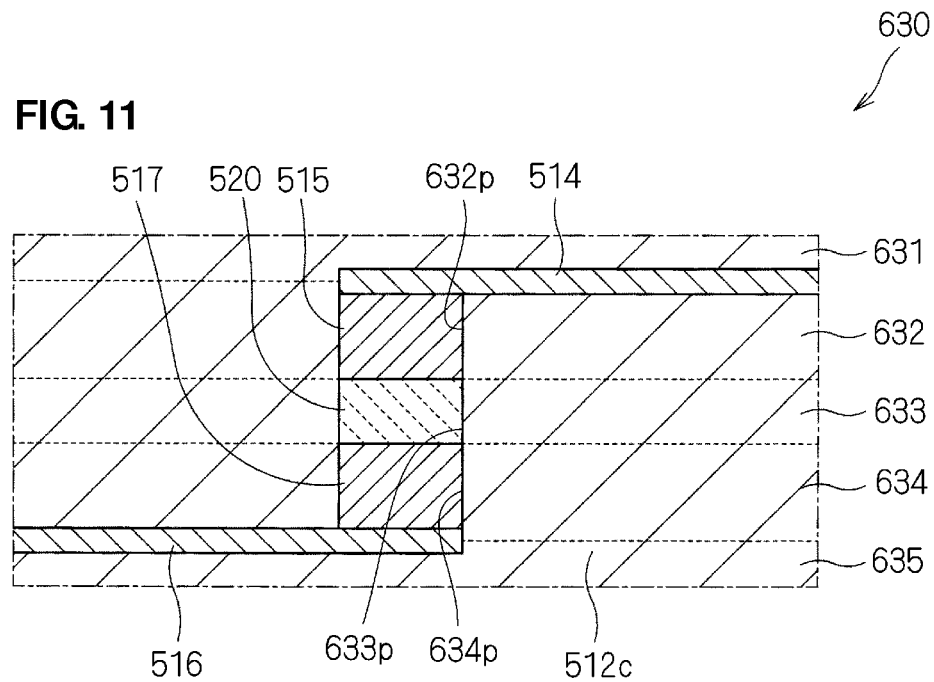
FIG. 11 is a cross sectional view of the principal portion of an ESD protection device according to a first modification of the fourth preferred embodiment of the present invention.

FIG. 11 is a cross sectional view of the principal portion of an ESD protection device 630 of a first modification of the fourth preferred embodiment of the present invention.

As illustrated in FIG. 11, the mixed portion 520 is connected to the interlayer connection conductors 515 and 517 in a ceramic multilayer substrate 512c in which a plurality of insulating layers 631 to 635 containing a ceramic material are laminated. The interlayer connection conductors 515 and 517 are provided in cylindrical via holes 632p and 634p formed in the insulating layers 632 and 634. The interlayer connection conductors 515 and 517 have conductivity. The interlayer connection conductors 515 and 517 are connected to the in-plane connection conductors 514 and 516, respectively.

Due to the fact that the ESD protection device 630 includes not only the in-plane connection conductors 514 and 516 but the interlayer connection conductors 515 and 517 vertically disposed in combination, the degree of freedom for design in the ceramic multilayer substrate 512c increases.

Second Modification of Fourth Preferred Embodiment

Figure 12:
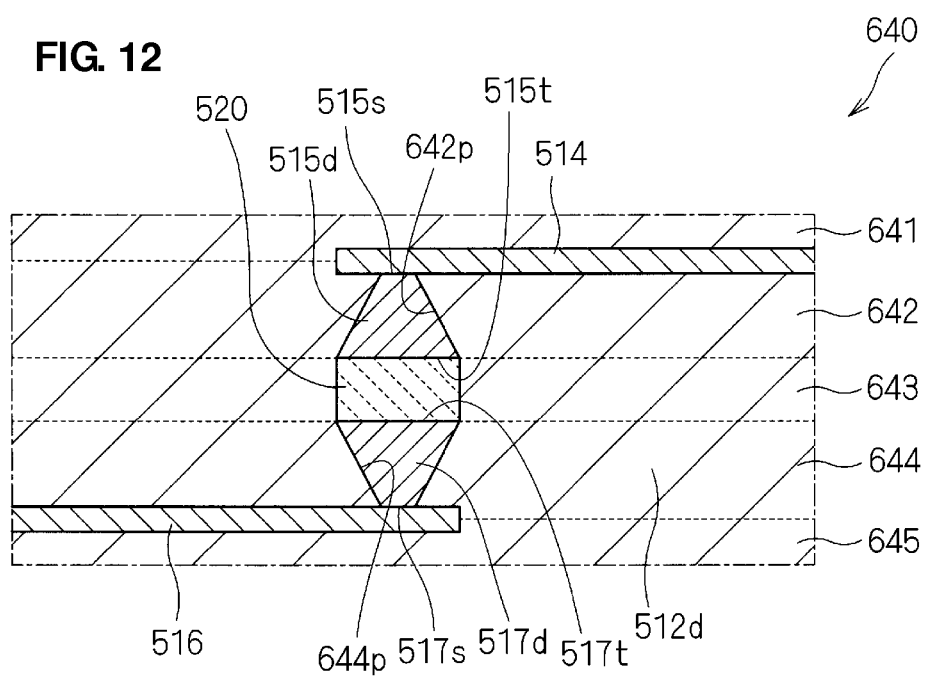
FIG. 12 is a cross sectional view of the principal portion of an ESD protection device according to a second modification of the fourth preferred embodiment of the present invention.

FIG. 12 is a cross sectional view of the principal portion of an ESD protection device 640 of the second modification of the fourth preferred embodiment of the present invention.

As illustrated in FIG. 12, in the ESD protection device 640, the mixed portion 520 is connected to interlayer connection conductors 515d and 517d in a ceramic multilayer substrate 512d in which a plurality of insulating layers 641 to 645 containing a ceramic material are laminated similar to the first modification of the fourth preferred embodiment. The interlayer connection conductors 515d and 517d are connected to the in-plane connection conductors 514 and 516, respectively.

The interlayer connection conductors 515d and 517d have a truncated cone shape unlike the first modification of the fourth preferred embodiment. More specifically, the interlayer connection conductors 515d and 517d are provided in conical via holes 642p and 644p formed in insulating layers 642 and 644. The conical via holes 642p and 644p can be formed using laser or a metallic mold in ceramic green sheets defining the insulating layers 642 and 644.

The interlayer connection conductors 515d and 517d are different in the size of end surfaces 515s and 515t and end surfaces 517s and 517t, respectively, at both sides in the lamination direction. The smaller end surfaces 515s and 517s of the interlayer connection conductors 515d and 517d, respectively, are connected to the in-plane connection conductors 514 and 516, respectively. The larger end surfaces 515*t* and 517*t* of the interlayer connection conductors 515*d* and 517*d*, respectively, are connected to the mixed portion 520. Thus, the electric discharge width can be increased, and therefore the ESD characteristics become good.

Third Modification of Fourth Preferred Embodiment

Figure 21:
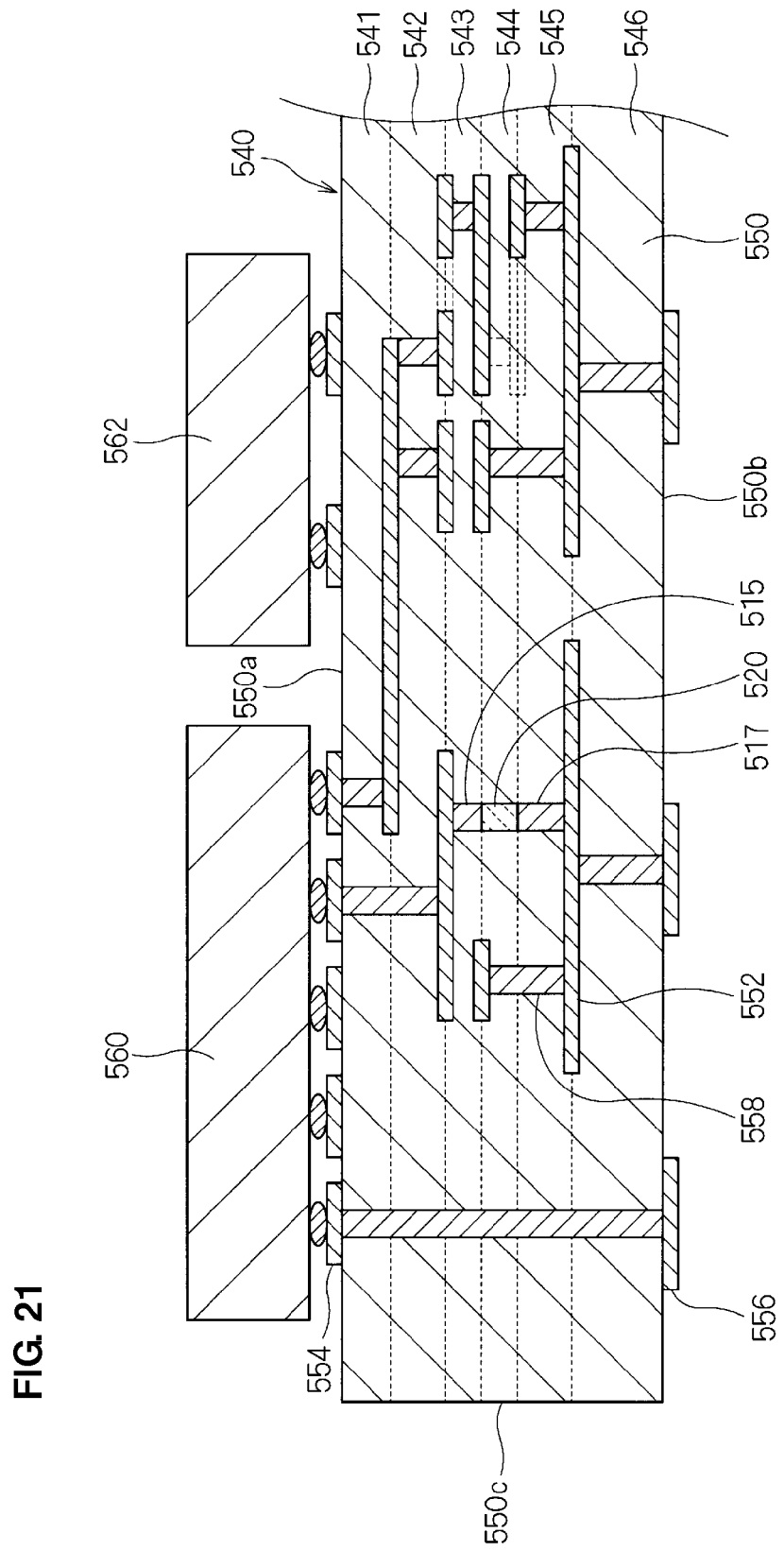
FIG. 21 is a cross sectional view of the principal portion of an ESD protection device according to a third modification of the fourth preferred embodiment of the present invention.
Figure 24:
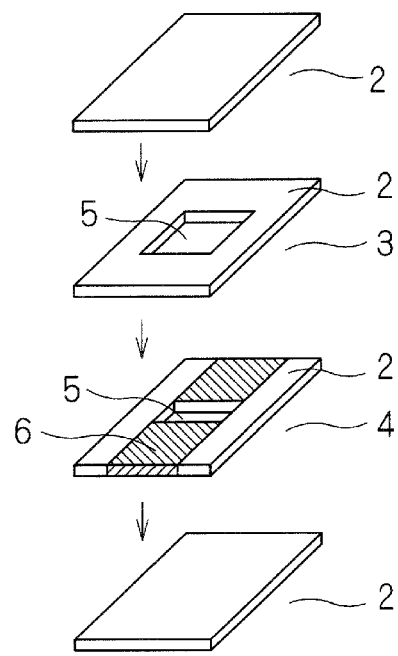
FIG. 24 is an exploded perspective view of a conventional ESD protection device.
Figure 25:
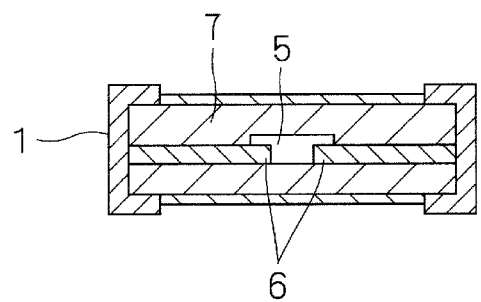
FIG. 25 is a cross sectional view of the conventional ESD protection device.

The cross sectional view of FIG. 21 schematically illustrates the cross-sectional structure of a substrate 540 with an ESD protection function which is an ESD protection device of a third modification of the fourth preferred embodiment.

As illustrated in FIG. 21, the substrate 540 with an ESD protection function is a modular component in which an IC chip 560 or a mounting component 562 other than the IC chip is mounted on a top surface 550*a* of a ceramic multilayer substrate 550 in which insulating layers 541 and 546 containing a ceramic material are laminated. In the ceramic multilayer substrate 550, an inductor element, a capacitor element, and a circuit pattern are defined by an in-plane connection conductor 552 and an interlayer connection conductor 558. On the top surface 550*a* and a bottom surface 550*b* of the ceramic multilayer substrate 550, external electrodes 554 and 556 are provided, respectively. In the ceramic multilayer substrate 550, the interlayer connection conductors 515 and 517 and the mixed portion 520 are formed similar to the fourth preferred embodiment.

Although FIG. 21 illustrates the case where components are mounted only on one surface 550*a* of the ceramic multilayer substrate 550, components may be mounted at both surfaces 550*a* and 550*b* of the ceramic multilayer substrate 550 or a hollow portion may be formed in the ceramic multilayer substrate 550, and then a component may be disposed therein.

Since the substrate 540 with an ESD protection function is a module component having an ESD protection portion defined by the interlayer connection conductors 515 and 517 and the mixed portion 520 in the ceramic multilayer substrate 550, the substrate 540 is advantageous in terms of the cost or occupied volume as compared with the case where the same function is constituted by separate components.

Since the substrate 540 with an ESD protection function has high design flexibility, the substrate 540 can satisfy various needs for ESD protection. In particular, since the volume of the ESD protection portion is small, the ESD protection portion can be disposed at every place in the module.

Fifth Preferred Embodiment

An ESD protection device 650 according to a fifth preferred embodiment of the present invention is described with reference to FIG. 13.

Figure 13:
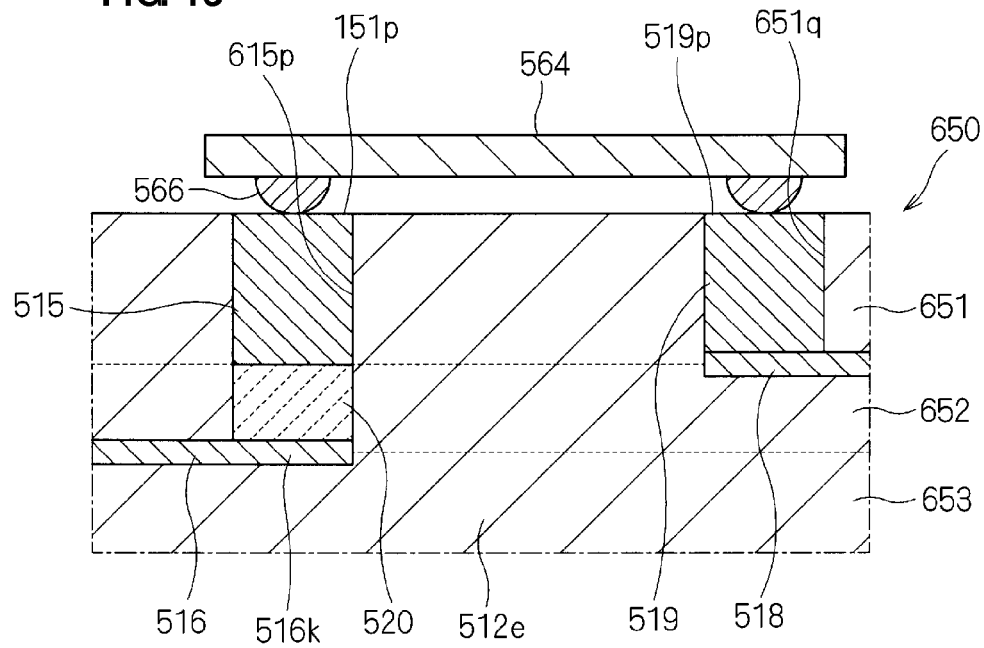
FIG. 13 is a cross sectional view of the principal portion of an ESD protection device according to a fifth preferred embodiment of the present invention.

FIG. 13 is a cross sectional view of the principal portion of the ESD protection device 650 of the fifth preferred embodiment. As illustrated in FIG. 13, in the ESD protection device 650, the interlayer connection conductors 515 and 519, the in-plane connection conductors 516 and 518, and the mixed portion 520 are provided in a ceramic multilayer substrate 512*e* in which a plurality of insulating layers 651 to 653 containing a ceramic material are laminated. The mixed portion 520 is connected to one interlayer connection conductor 515 and a facing portion 516*k* of one in-plane connection conductor 516. The other interlayer connection conductor 519 and the other in-plane connection conductor 518 are connected to each other.

The interlayer connection conductors 515 and 519 are provided in via holes 651*p* and 651*q* of the insulating layer 651 at the outermost portion of the ceramic multilayer substrate 12*e*. Bumps 566 of an IC chip 564 are connected to one end surface 515*p* and one end surface 519*p* of the interlayer connection conductors 515 and 519, respectively.

In the ESD protection device 650, the distance from the IC chip 564 to the mixed portion 520 can be shortened by forming a structure in which the mixed portion 520 functioning as an ESD protection element is disposed on the extension of the interlayer connection conductor 515 provided directly under the bump 566 of the IC chip 564, the ESD responsiveness improves and the ESD protection can be effectively realized.

Sixth Preferred Embodiment

An ESD protection device 660 of a sixth preferred embodiment of the present invention is described with reference to FIG. 14.

Figure 14:
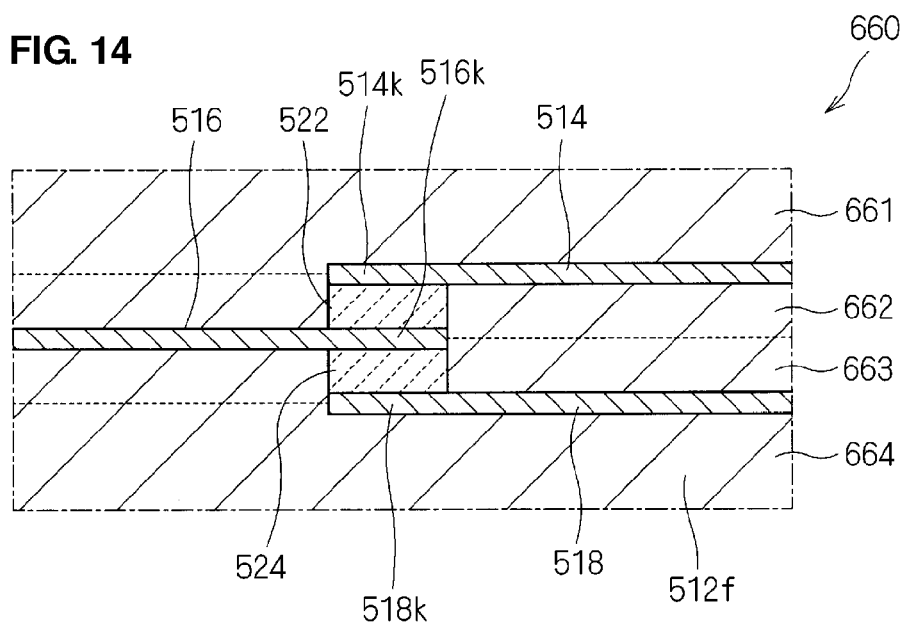
FIG. 14 is a cross sectional view of the principal portion of an ESD protection device according to a sixth preferred embodiment of the present invention.

FIG. 14 is a cross sectional view of the principal portion of the ESD protection device 660 of the sixth preferred embodiment. As illustrated in FIG. 14, in the ESD protection device 660, three in-plane connection conductors 514, 516, and 518 and two mixed portions 522 and 524 are provided in a ceramic multilayer substrate 512*f* in which a plurality of insulating layers 661 to 664 containing a ceramic material are laminated.

The mixed portions 522 and 524 are located at both sides in the lamination direction (vertical direction in FIG. 14) of the facing portion 516*k* of the middle in-plane connection conductor 516. More specifically, the facing portions 514*k* and 516*k* of the in-plane connection conductors 514 and 516, respectively, are connected to both sides in the lamination direction of the mixed portion 522. The facing portions 516*k* and 518*k* of the in-plane connection conductors 516 and 518 are connected to both sides in the lamination direction of the mixed portion 524.

For example, the middle in-plane connection conductor 516 is electrically connected to the input terminal and the other two in-plane connection conductors 514 and 518 are electrically connected to the ground terminal. In this case, since the mixed portions 522 and 524 functioning as an ESD protection element are electrically connected in parallel between the input terminal and the ground terminal, the ESD responsiveness becomes good and the peak voltage can be reduced.

First Modification of Sixth Preferred Embodiment

Figure 15:
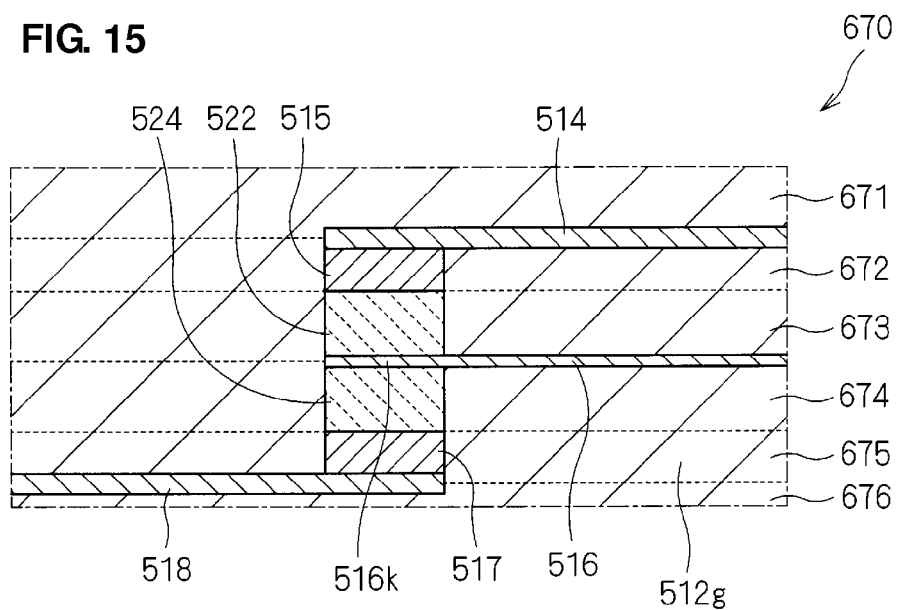
FIG. 15 is a cross sectional view of the principal portion of an ESD protection device according to a first modification of the sixth preferred embodiment of the present invention.

FIG. 15 is a cross sectional view of the principal portion of an ESD protection device 670 of a first modification of the sixth preferred embodiment.

As illustrated in FIG. 15, in the ESD protection device 670 of the first modification of the sixth preferred embodiment, the three in-plane connection conductors 514, 516, and 518 and the two mixed portions 522 and 524 are provided in a ceramic multilayer substrate 512*g* in which a plurality of insulating layers 671 to 676 containing a ceramic material are laminated similarly as in the ESD protection device 660 of the sixth preferred embodiment. Unlike the sixth preferred embodiment, the interlayer connection conductors 515 and 517 are further provided. The interlayer connection conductors 515 and 517 are connected to the in-plane connection conductors 514 and 518, respectively. The mixed portions 522 and 524 are connected to the facing portion 516*k* of the middle in-plane connection conductor 516 and the interlayer connection conductors 515 and 517, respectively.

For example, the middle in-plane connection conductor 516 is electrically connected to the input terminal and the other in-plane connection conductors 514 and 518 at both outsides in the lamination direction are electrically connected to the ground terminal. In this case, since ESD protection elements defined by the mixed portions 522 and 524 are electrically connected in parallel between the input terminal and the ground terminal, the ESD responsiveness becomes good and the peak voltage can be reduced.

Seventh Preferred Embodiment

An ESD protection device 680 of a seventh preferred embodiment of the present invention is described with reference to FIG. 16.

Figure 16:
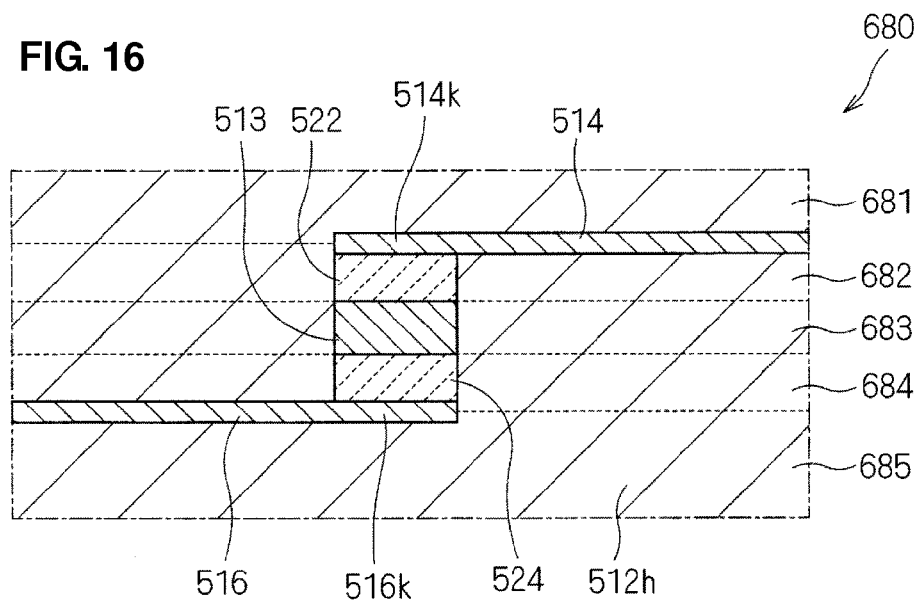
FIG. 16 is a cross sectional view of the principal portion of an ESD protection device according to a seventh preferred embodiment of the present invention.

FIG. 16 is a cross sectional view of the principal portion of the ESD protection device 680 of the seventh preferred embodiment. As illustrated in FIG. 16, in the ESD protection device 680, the two in-plane connection conductors 514 and 516, one interlayer connection conductor 513, and the two mixed portions 522 and 524 are provided in a ceramic multilayer substrate 512h in which a plurality of insulating layers 681 to 685 containing a ceramic material are laminated. The mixed portions 522 and 524 are connected to the interlayer connection conductor 513 and the facing portions 514k and 516k of the in-plane connection conductors 514 and 516, respectively. More specifically, the mixed portions 522 and 524 are connected in series through the interlayer connection conductor 513 between the in-plane connection conductors 514 and 516.

In the ESD protection device 680, two electric discharge protection portions defined by the mixed portions 522 and 524 are arranged in series. Therefore, when an electrostatic pulse is repeatedly applied to cause short-circuit in one side, the other side functions. Therefore, the reliability of the ESD protection function improves as compared with the case where the number of the mixed portions is only one.

First Modification of Seventh Preferred Embodiment

Figure 17:
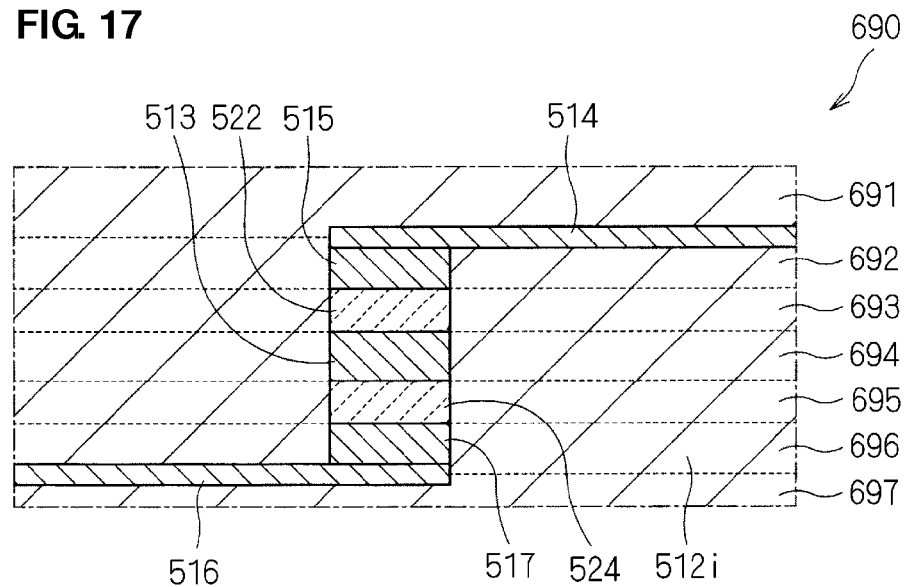
FIG. 17 is a cross sectional view of the principal portion of an ESD protection device according to a first modification of the seventh preferred embodiment of the present invention.

FIG. 17 is a cross sectional view of the principal portion of an ESD protection device 690 of a first modification of the seventh preferred embodiment of the present invention.

As illustrated in FIG. 17, in the ESD protection device 690, the in-plane connection conductors 514 and 516, the interlayer connection conductor 513, and the mixed portions 522 and 524 are provided in a ceramic multilayer substrate 512i in which a plurality of insulating layers 691 to 697 containing a ceramic material are laminated similarly as in the ESD protection device 680 of the seventh preferred embodiment. Unlike the ESD protection device 680 of the seventh preferred embodiment, the interlayer connection conductors 515 and 517 are further provided. The interlayer connection conductors 515 and 517 are connected to the in-plane connection conductors 514 and 516, respectively. The mixed portions 522 and 524 are connected to the interlayer connection conductors 515 and 517, respectively, and the interlayer connection conductor 513.

In the ESD protection device 690, two electric discharge protection portions defined by the mixed portions 522 and 524 are arranged in series. Therefore, when an electrostatic pulse is repeatedly applied to cause short-circuit in one side, the other side functions. Therefore, the reliability of the ESD protection function improves as compared with the case where the number of the mixed portions is only one.

Eighth Preferred Embodiment

An ESD protection device 700 according to an eighth preferred embodiment of the present invention is described with reference to FIG. 18.

Figure 18:
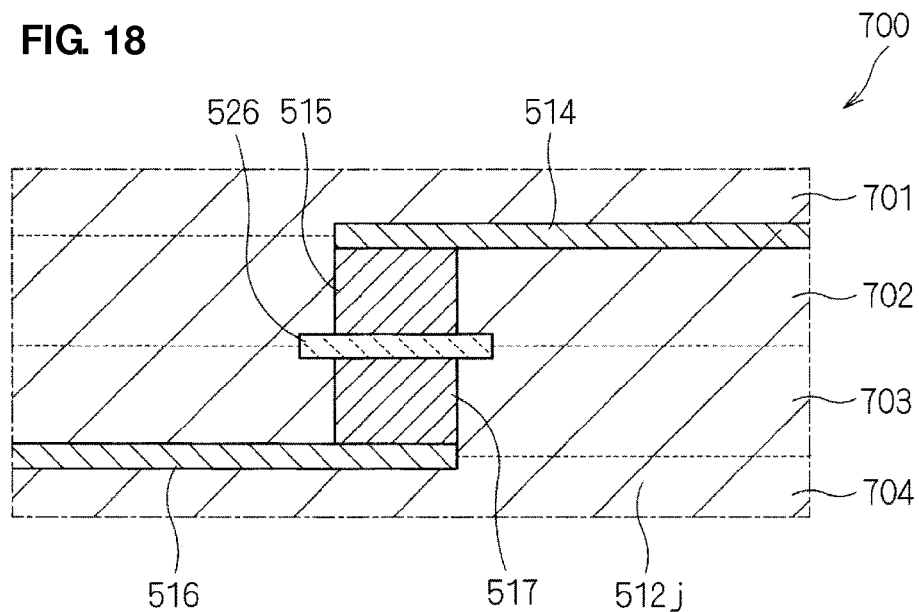
FIG. 18 is a cross sectional view of the principal portion of an ESD protection device according to an eighth preferred embodiment of the present invention.

FIG. 18 is a cross sectional view of the principal portion of the ESD protection device 700. As illustrated in FIG. 18, in the ESD protection device 700, the in-plane connection conductors 514 and 516, the interlayer connection conductors 515 and 517, and a mixed portion 526 are provided in a ceramic multilayer substrate 512j in which a plurality of insulating layers 701 to 704 containing a ceramic material are laminated. The interlayer connection conductors 515 and 517 are connected to the in-plane connection conductors 514 and 516, respectively.

The mixed portion 526 extends between the insulating layers 702 and 703 adjacent to each other and is connected to the interlayer connection conductors 515 and 517. The interlayer connection conductors 515 and 517 face each other in the lamination direction (vertical direction in FIG. 18) of the insulating layers 701 to 704 through the mixed portion 526.

As illustrated in FIG. 18, when the outer diameter (width) of the mixed portion 526 is made larger than the outer diameter of the interlayer connection conductors 515 and 517, the position shift of the mixed portion 526 and the interlayer connection conductors 515 and 517 can be absorbed. However, the outer diameter (width) of the mixed portion 526 may be the same as the outer diameter of the interlayer connection conductors 515 and 517 or the outer diameter (width) of the mixed portion 526 may be smaller than the outer diameter of the interlayer connection conductors 515 and 517.

The thickness of the mixed portion 526 preferably is about 5 μm to about 30 μm, for example, and can be freely adjusted by an easy print forming method, and the interval (electric discharge gap) between the interlayer connection conductors 515 and 517 can be reduced. When the electric discharge gap is reduced, the ESD characteristics (peak voltage value and the like) improve.

First Modification of Eighth Preferred Embodiment

FIG. 22 is a cross sectional view of the principal portion of an ESD protection device 700a of a first modification of the eighth preferred embodiment of the present invention.

As illustrated in FIG. 22, the ESD protection device 700a of the first modification of the eighth preferred embodiment is provided with a seal layer 530 between the mixed portion 526 and the insulating layers 702 and 703 in addition to the configuration of the eighth preferred embodiment. The seal layer 530 prevents the glass component in the ceramic multilayer substrate from entering the mixed portion 526. The seal layer 530 has insulation properties.

Such a configuration can be produced by forming ceramic green sheets defining the insulating layers 701 to 704 as illustrated in the cross sectional view of FIGS. 23A to 23D, laminating, pressure-bonding, and firing them.

More specifically, as illustrated in FIGS. 23A and 23D, portions defining the in-plane connection conductors 514 and 516 are formed using an electrode paste on one main surface 701t and one main surface 704s of the ceramic green sheets defining the insulating layer 701 and 704, respectively.

Moreover, as illustrated in FIGS. 23B and 23C, via holes 702p and 703p are formed in the ceramic green sheets defining the insulating layers 702 and 703, and then an electrode paste is charged into the via holes 702p and 703p to form portions defining the interlayer connection conductors 515 and 517.

Then, by printing a seal layer formation paste, seal layers 532 and 534 having openings 533 and 535 are formed on facing surfaces 702t and 703t of the insulating layers 702 and 703, respectively. In this case, the seal layers 532 and 534 are formed such that portions defining the interlayer connection conductors 515 and 517 are exposed from the openings 533 and 535 of the seal layers 532 and 534.

Separately, a portion defining the mixed portion 526 is formed on one seal layer 534 using a mixed paste.

The portion defining the mixed portion 526 may be formed on the other seal layer 532 or may be formed on both the seal layers 532 and 534.

The seal layer 532 may be formed on the side of the ceramic green sheet defining the insulating layer 703. More specifically, the seal layer 534 and the portion defining the mixed portion 526 may be formed on the ceramic green sheet defining the insulating layer 703, and then the seal layer 532 may be further formed thereon. On the contrary, the seal layer 532 and the portion defining the mixed portion 526 may be formed on the ceramic green sheet defining the insulating layer 702, and then the seal layer 534 may be further formed thereon.

The seal layer formation paste for forming the seal layer is preferably produced by the same technique as that for the electrode paste. For example, the seal layer formation paste (alumina paste) is preferably obtained by adding a solvent to a binder resin containing about 80 wt % of $Al_2O_3$ powder having an average particle diameter of about 1 μm, ethyl cellulose, and the like, and then stirring and mixing them by a roll. For the seal layers, materials whose sintering temperature is higher than that of substrate materials, such as alumina, zirconia, magnesia, mullite, and quartz, are selected.

Subsequently, ceramic green sheets defining the insulating layers 701 to 704 are laminated, pressure-bonded, and then fired.

The seal layer may be formed between the mixed portion formed in the via hole of the insulating layer and the insulating layer, i.e., the inner circumference surface of the via hole. In this case, for example, the seal layer formation paste is charged into the via hole from one opening of the via hole of the ceramic green sheet, the seal layer formation paste is sucked from the other opening of the via hole to thereby attach the seal layer formation paste to the inner circumference surface of the via hole, and then the paste is dried. Subsequently, a mixed portion formation paste is charged into the via hole, pressure-bonded to another ceramic layer, and then fired to thereby form the seal layer between the mixed portion and the insulating layer.

In various preferred embodiments of the present invention described above, by forming the mixed portion in which two or more kinds of solid components different in the conductivity and cavities are dispersed as described above, the adjustment or the stabilization of the ESD characteristics is facilitated. By connecting in-plane connection conductors or interlayer connection conductors to both sides in the lamination direction of a mixed portion, the adjustment or the stabilization of the ESD characteristics is facilitated.

The present invention is not limited to the above-described preferred embodiments and can be carried out with various alterations and modifications.

For example, the mixed portion or the connection conductor connected to the mixed portion may be formed on the front surface of the substrate. In this case, it is configured so that the connection conductor is partially connected to a mounting land, and the mixed portion or the connection conductor is coated with resin or a metal casing through a coating layer. Thus, the mixed portion can be more easily processed as compared with the case where the mixed portion is formed in an internal layer of the substrate, and by forming the same on a component mounting surface, the ESD protection measures can be taken at a portion closer to a mounting component, so that the components can be more reliably protected from ESD.

When forming the mixed portion on the front surface of the substrate, a connection conductor is printed on the front surface of the substrate, a mixed paste containing a solid component and a cavity formation material is printed to a portion where the mixed portion is to be formed, and then a paste obtained by mixing glass with alumina is applied in so as to cover a portion of the connection conductor and the portion where the mixed portion is to be formed and then fired to thereby form a coating layer. A coating layer of resin may be provided so as to cover a part of the mixed portion and the connection conductor without applying the paste obtained by mixing glass with alumina.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An ESD protection device comprising:
   an insulating substrate including insulating layers laminated on each other in a lamination direction;
   at least two first and second connection conductors provided in the insulating substrate and having conductivity; and
   a mixed portion provided in the insulating substrate, disposed between the first and second connection conductors, connected to the first and second connection conductors and containing at least one solid component of (i) a metal and a semiconductor, (ii) a metal, a semiconductor, and ceramic, (iii) a metal coated with an inorganic material and a semiconductor, and (iv) a metal coated with an inorganic material, a semiconductor, and ceramic; wherein
   the at least one solid component and a cavity are dispersed in the mixed portion.

2. The ESD protection device according to claim 1, wherein the insulating substrate is a ceramic multilayer substrate.

3. The ESD protection device according to claim 2, wherein the first and second connection conductors are arranged to penetrate between main surfaces of at least one of the insulating layers or along the main surface of the at least one of the insulating layers; and
   different ones of the connection conductors are connected to the mixed portion so as to face each other in the lamination direction through the mixed portion at both sides in the lamination direction of the insulating layer.

4. The ESD protection device according to claim 1, wherein the at least one solid component in the mixed portion contains a metal material coated with an inorganic material having insulation properties and a semiconductor material.

5. The ESD protection device according to claim 4, wherein the semiconductor material is silicon carbide or zinc oxide.

6. The ESD protection device according to claim 1, wherein a penetration hole is arranged in at least one of the insulating layers of the insulating substrate to penetrate between main surfaces of the insulating layer and the mixed portion is provided in the penetration hole.

7. The ESD protection device according to claim 1, wherein the mixed portion is located between the insulating layers adjacent to each other of the insulating substrate.

8. The ESD protection device according to claim 1, wherein a seal layer extending between the insulating layer and the mixed portion is further provided.

9. The ESD protection device according to claim 1, wherein the mixed portion contains a metal material and a semiconductor material which are dispersed.

10. The ESD protection device according to claim 9, wherein the semiconductor material is silicon carbide or zinc oxide.

11. The ESD protection device according to claim 1, wherein, in the mixed portion, particles of a metal material coated with an inorganic material having insulation properties are dispersed.

12. The ESD protection device according to claim 1, further comprising:
   two or more of the mixed portions defining first mixed portion and a second mixed portion; wherein
   the first and second connection conductors are connected to one end in the lamination direction of the first mixed portion and connected to one end in the lamination direction of the second mixed portion, respectively;
   a third connection conductor is connected to the other end in the lamination direction of the first mixed portion and the other end in the lamination direction of the second mixed portion;
   the first and second terminals are electrically connected to the first and second connection conductors, respectively, and the first and second mixed portions are electrically connected in series between the first and second terminal through the third connection conductor.

13. The ESD protection device according to claim 1, further comprising:
   two or more of the mixed portions defining a first mixed portion and a second mixed portion; wherein
   the first and second connection conductors are connected to one end in the lamination direction of the first mixed portion and connected to one end in the lamination direction of the second mixed portion, respectively;
   a third connection conductor is connected to the other end in the lamination direction of the first mixed portion and the other end in the lamination direction of the second mixed portion;
   first, second, and third terminals are electrically connected to the first, second, and third connection conductors, respectively, and the first and second mixed portions are electrically connected in parallel between the first and second terminals and the third terminal.

14. The ESD protection device according to claim 1, further comprising:
   an electronic component mounted on the ceramic multilayer substrate or in the ceramic multilayer substrate;
   a fourth connection conductor connected to at least one terminal of the electronic component; and
   a fifth connection conductor; wherein
   the fourth and the fifth connection conductors are connected to both sides in the lamination direction of the mixed portion so as to face each other in the lamination direction through the mixed portion.

15. An ESD protection device comprising:
   an insulating substrate including insulating layers laminated on each other in a lamination direction;
   at least two first and second connection conductors provided in the insulating substrate and having conductivity; and
   a mixed portion provided in the insulating substrate, disposed between the first and second connection conductors, connected to the first and second connection conductors and containing at least one solid component of (i) a metal and a semiconductor, (ii) a metal and ceramic, (iii) a metal, a semiconductor, and ceramic, (iv) a semiconductor and ceramic, (v) a semiconductor, (vi) a metal coated with an inorganic material, (vii) a metal coated with an inorganic material and a semiconductor, (viii) a metal coated with an inorganic material and ceramic, and (ix) a metal coated with an inorganic material, a semiconductor, and ceramic; wherein
   the at least one solid component and a cavity are dispersed in the mixed portion;
   the first and second connection conductors are arranged to penetrate between main surfaces of at least one of the insulating layers or along the main surface of the at least one of the insulating layers; and
   different ones of the connection conductors are connected to the mixed portion so as to face each other in the lamination direction through the mixed portion at both sides in the lamination direction of the insulating layer.

16. An ESD protection device comprising:
   an insulating substrate including insulating layers laminated on each other in a lamination direction;
   at least two first and second connection conductors provided in the insulating substrate and having conductivity; and
   a mixed portion provided in the insulating substrate, disposed between the first and second connection conductors, connected to the first and second connection conductors and containing at least one solid component of (i) a metal and a semiconductor, (ii) a metal and ceramic, (iii) a metal, a semiconductor, and ceramic, (iv) a semiconductor and ceramic, (v) a semiconductor, (vi) a metal coated with an inorganic material, (vii) a metal coated with an inorganic material and a semiconductor, (viii) a metal coated with an inorganic material and ceramic, and (ix) a metal coated with an inorganic material, a semiconductor, and ceramic; wherein
   the at least one solid component and a cavity are dispersed in the mixed portion; and
   a penetration hole is arranged in at least one of the insulating layers of the insulating substrate to penetrate between main surfaces of the insulating layer and the mixed portion is provided in the penetration hole.

* * * * *